(12) United States Patent
Yi et al.

(10) Patent No.: US 9,627,469 B2
(45) Date of Patent: Apr. 18, 2017

(54) OXIDE FILM, INTEGRATED CIRCUIT DEVICE, AND METHODS OF FORMING THE SAME

(71) Applicant: Samsung Electronics Co., Ltd., Suwon-si (KR)

(72) Inventors: Ha-young Yi, Seongnam-si (KR); Jun-won Lee, Chungcheongnam-do (KR); Byoung-deog Choi, Suwon-si (KR); Jong-myeong Lee, Seongnam-si (KR); Mun-jun Kim, Suwon-si (KR); Hong-gun Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/972,903

(22) Filed: Dec. 17, 2015

(65) Prior Publication Data

US 2016/0343799 A1 Nov. 24, 2016

(30) Foreign Application Priority Data

May 19, 2015 (KR) .................. 10-2015-0069350

(51) Int. Cl.
*H01L 29/40* (2006.01)
*H01L 49/02* (2006.01)

(52) U.S. Cl.
CPC .................. *H01L 28/91* (2013.01)

(58) Field of Classification Search
CPC ......... H01L 21/02129; H01L 21/02164; H01L 21/02271; H01L 21/02274; H01L 21/31111; H01L 21/31612; H01L 21/31625

USPC ........................................ 438/784
See application file for complete search history.

(56) References Cited

U.S. PATENT DOCUMENTS

| 7,638,161 B2 | 12/2009 | Mukai et al. |
| 2002/0052112 A1* | 5/2002 | Lee .................. H01L 21/02129 438/689 |
| 2005/0212093 A1* | 9/2005 | Takamori .............. C23C 16/401 257/632 |

(Continued)

FOREIGN PATENT DOCUMENTS

| JP | 3948220 | 7/2007 |
| KR | 20010065399 | 7/2001 |

(Continued)

*Primary Examiner* — Trung Q Dang
(74) *Attorney, Agent, or Firm* — Onello & Mello, LLP

(57) ABSTRACT

A doped mold film is formed with a dopant concentration gradient in the doped mold film that continuously varies in a thickness direction and a portion of the doped mold film is etched in the thickness direction to form a hole so that an electrode can be formed along an inner wall of the hole. The electrode thus formed includes a first outer wall surface, a second outer wall surface, and a third outer wall surface wherein the first outer wall surface is in contact with a sidewall of an insulating pattern formed on a substrate within a through hole formed in the insulating pattern; the second outer wall surface is in contact with a top surface of the insulating pattern and extends in a lateral direction; the third outer wall surface is spaced apart from the first outer wall surface with the second outer wall surface therebetween; and the third outer wall surface extends on the insulating pattern in a direction away from the substrate.

9 Claims, 34 Drawing Sheets

(56) References Cited

U.S. PATENT DOCUMENTS

2006/0281246 A1* 12/2006 Tegen ............... H01L 21/31111
            438/232
2007/0120230 A1* 5/2007 Kim ................. H01L 21/02129
            257/645

FOREIGN PATENT DOCUMENTS

| KR | 20030049608 | 6/2003 |
| KR | 20030067379 | 8/2003 |
| KR | 100431739 | 5/2004 |
| KR | 20040064841 | 7/2004 |
| KR | 100571634 | 4/2006 |

* cited by examiner

OXIDE FILM, INTEGRATED CIRCUIT DEVICE, AND METHODS OF FORMING THE SAME

CROSS-REFERENCE TO RELATED APPLICATION

This application claims the benefit of Korean Patent Application No. 10-2015-0069350, filed on May 19, 2015, in the Korean Intellectual Property Office, the disclosure of which is incorporated herein in its entirety by reference.

BACKGROUND

The inventive concept relates to an oxide film, an integrated circuit (IC) device, and methods of forming the same, and more particularly, to a doped oxide film, an IC device including a capacitor manufactured by using the doped oxide film, and methods of forming the same.

With an increase in the integration density of semiconductor devices, a capacitor capable of ensuring a sufficient capacitance within a limited area may be needed. However, with a reduction in the design rules of semiconductor devices, an aspect ratio of a capacitor having a three-dimensional (3D) structure may increase. Thus, the degree of difficulty of forming a capacitor capable of controlling failures due to a reduction in critical dimension (CD) and ensuring a sufficient capacitance may increase.

SUMMARY

The inventive concept provides an oxide film, which may be used to manufacture an integrated circuit (IC) device including a structure having a relatively high aspect ratio, and a method of manufacturing the oxide film.

The inventive concept also provides an IC device including a three-dimensional (3D) capacitor having a relatively high aspect ratio. The capacitor may include a lower electrode having approximately vertical sidewalls to ensure a vertical profile of the lower electrode and to maximize a surface area of the lower electrode.

In addition, the inventive concept provides an IC device including a capacitor with an electrode having a smooth surface. A sidewall of the capacitor of the IC device may be formed so as to not include a stepped portion or a protrusion having pointed spots, which may cause failures.

Furthermore, the inventive concept provides a method of manufacturing an IC device which includes forming a lower electrode of a three-dimensional (3D) capacitor having a relatively high aspect ratio. During the formation of the lower electrode, formation of pointed spots that may cause failures to profiles of sidewalls of the lower electrode may be inhibited or avoided.

According to an aspect of the inventive concept, there is provided an oxide film including at least one dopant species, in which the oxide film has a dopant concentration gradient that continuously varies from a higher to a lower concentration or vice versa in a thickness direction of the oxide film.

The at least one dopant species may include a plurality of dopant species, and the sum of the concentrations of the plurality of dopant species may continuously decrease from a bottom surface of the oxide film toward a top surface thereof.

The at least one dopant species may include a first dopant species and a second dopant species. The oxide film may include a first thickness portion in which a concentration of the first dopant species continuously varies from a higher to a lower concentration or vice versa in the thickness direction while a concentration of the second dopant species remains constant in the thickness direction, and a second thickness portion in which a concentration of the first dopant species remains constant in the thickness direction while a concentration of the second dopant species continuously varies from a higher to a lower concentration or vice versa in the thickness direction.

The oxide film may include a boro phospho silicate glass (BPSG) film. The BPSG film may include a first thickness portion in which a concentration of a dopant B is variable in the thickness direction and a concentration of a dopant P is constant in the thickness direction, and a second thickness portion in which a concentration of the dopant B is constant in the thickness direction and a concentration of the dopant P is variable in the thickness direction. A thickness of the first thickness portion may be greater than a thickness of the second thickness portion.

According to another aspect of the inventive concept, there is provided an IC device including an insulating pattern formed on a substrate having a conductive region. The insulating pattern has a through hole exposing the conductive region. A first electrode protrudes in a direction away from the substrate, from inside the through hole to above the insulating pattern. A first support pattern extends at a first level spaced apart from the insulating pattern. The first support pattern is in contact with a first portion of the first electrode and supports the first electrode. The first electrode includes a first outer wall surface in contact with a sidewall of the insulating pattern within the through hole, a second outer wall surface in contact with a top surface of the insulating pattern and extending in a lateral direction, and a third outer wall surface spaced apart from the first outer wall surface with the second outer wall surface therebetween. The third outer wall surface extends on the insulating pattern in a direction away from the substrate.

The first electrode, the first outer wall surface, the second outer wall surface, and the third outer wall surface may be sequentially connected and form a stepped outer wall surface.

The third outer wall surface may extend on the insulating pattern to a second level closer to the substrate than the first level in the direction away from the substrate.

The first electrode may further include a fourth outer wall surface extending from the third outer wall surface to the first level in the direction away from the substrate. The third outer wall surface may form a reference angle with a plane surface that is parallel to a main surface of the substrate. The fourth outer wall surface may form a first inclination angle with the plane surface that is parallel to the main surface of the substrate, wherein the first inclination angle is smaller than the reference angle.

A height of the fourth outer wall surface may be smaller than a height of the third outer wall surface.

The IC device may further include a second support pattern extending at a third level that is farther from the insulating pattern than the first level. The second support pattern may be in contact with a second portion of the first electrode spaced apart from the first portion of the first electrode that also supports the first electrode. The first electrode may further include a fifth outer wall surface that extends in the direction away from the substrate at a level between the first level and the third level and forms a second inclination angle with the plane surface that is parallel to the main surface of the substrate. The second inclination angle of the fifth outer wall surface may be equal to the reference angle of the third outer wall surface.

The IC device may further include a dielectric film being in contact with the third outer wall surface, and a second electrode facing the first electrode with the dielectric film interposed between the first electrode and the second electrode.

The first electrode may have a cylindrical shape defining an inner space (opening) thereof.

A first width of a portion of the first outer wall surface of the first electrode, which is closest to the third outer wall surface, may be at least 2 nm less than a second width of a portion of the third outer wall surface of the first electrode, which is closest to the first outer wall surface.

The third outer wall surface may form a right angle with the plane surface that is parallel to the main surface of the substrate.

According to another aspect of the inventive concept, there is provided a method of forming an oxide film. The method includes forming a doped oxide film on a substrate so as to have a dopant concentration gradient, which continuously varies in a thickness direction, by continuously varying a flow rate of at least one dopant source that is being supplied to the substrate.

During the formation of the doped oxide film, the doped oxide film may be formed such that a dopant concentration continuously decreases in a thickness direction of the doped oxide film in a direction away from the substrate.

The formation of the doped oxide film may include supplying a plurality of dopant sources for providing a plurality of different dopant species to the substrate. The total amount of the plurality of dopant sources being supplied to the substrate may continuously decrease during the formation of the doped oxide film.

The formation of the doped oxide film may include a step of supplying a first dopant source to the substrate at a constant flow rate with respect to time, while supplying a second dopant source, which is different from the first dopant source, to the substrate at a flow rate that continuously decreases with respect to time.

According to another aspect of the inventive concept, there is provided a method of manufacturing an IC device. The method includes: forming a doped mold film on the substrate to have a dopant concentration gradient, which continuously varies in a thickness direction, by continuously varying a flow rate of at least one dopant source supplied to a substrate; forming a hole in the doped mold film by etching a portion of the doped mold film in the thickness direction; and forming an electrode to extend along an inner wall of the hole.

During the formation of the doped mold film, the doped mold film may be formed such that a dopant concentration continuously decreases in a direction away from the substrate in a thickness direction of the doped mold film.

The formation of the doped mold film may include a step of supplying a plurality of dopant sources for providing a plurality of different dopant species to the substrate, and the total amount of the plurality of dopant sources supplied to the substrate may continuously decrease during the formation of the doped mold film.

The formation of the doped mold film may include a step of supplying a plurality of dopant sources for providing a plurality of different dopant species to the substrate. The doped mold film may be formed such that the sum of the concentrations of the plurality of dopant species included in the doped mold film continuously decreases in a direction away from the substrate in the thickness direction.

The formation of the doped mold film may include a step of supplying a first dopant source to the substrate at a constant flow rate with respect to time while supplying a second dopant source different from the first dopant source to the substrate at a flow rate that continuously decreases with respect to time.

The formation of the doped mold film may include a step of supplying a first dopant source for providing a first dopant species to the substrate and a second dopant source for providing a second dopant species different from the first dopant species to the substrate. The doped mold film may be formed such that the sum of a concentration of the first dopant species and a concentration of the second dopant species in the doped mold film continuously decreases in a direction away from the substrate in the thickness direction.

The formation of the doped mold film may include a first operation of supplying a first dopant source for providing a first dopant species to the substrate and supplying a second dopant source for providing a second dopant species different form the first dopant species to the substrate together, and a second operation of supplying only one dopant source selected from the first dopant source and the second dopant source to the substrate. In some embodiments, in the first operation, the sum of a first flow rate of the first dopant source and a second flow rate of the second dopant source may continuously decrease with respect to time. In other embodiments, in the first operation, a first flow rate of the first dopant source may be constant with respect to time, and a second flow rate of the second dopant source may continuously decrease with respect to time. In other embodiments, in the second operation, an amount of the selected dopant source supplied to the substrate may continuously decrease with respect to time.

According to another aspect of the inventive concept, there is provided a method of manufacturing an IC device. The method includes: forming a doped mold film on a substrate having a conductive region to have a dopant concentration gradient, which continuously varies in a thickness direction, by continuously varying a flow rate of at least one dopant source supplied to the substrate; forming a capping mold film on the doped mold film; forming a support film on the capping mold film; forming a hole by etching the support film, the capping mold film, and the doped mold film, the hole penetrating the support film, the capping mold film, and the doped mold film and thereby exposing the conductive region; and forming an electrode within the hole, the electrode having an outer sidewall facing a sidewall of the support film, a sidewall of the capping mold film, and a sidewall of the doped mold film, each of which is exposed within the hole.

During the formation of the doped mold film, the doped mold film may be formed such that a dopant concentration continuously decreases in a direction away from the substrate in a thickness direction of the doped mold film.

During the formation of the doped mold film, the total amount of the at least one dopant source supplied to the substrate may continuously decrease with an increase in a thickness of the doped mold film.

The formation of the doped mold film may include forming a first doped mold film on the substrate such that a concentration of a first dopant species continuously decreases in a direction away from the substrate in a thickness direction, and forming a second doped mold film on the first doped mold film such that a concentration of a second dopant species different from the first dopant species continuously decreases in a direction away from the first doped mold film in the thickness direction. In some embodiments, the formation of the first doped mold film may include a step of supplying a first dopant source for providing the first dopant species to the substrate at a flow rate that continuously decreases with respect to time, while supplying a second dopant source for providing the second dopant species to the substrate at a constant flow rate with respect to time. In some embodiments, the formation of the second doped mold film may include a step of supplying a second dopant source for providing the second dopant species to the substrate at a flow rate that continuously decreases with respect to time.

At least a partial region of the doped mold film may include a plurality of dopant species including different dopant elements. During the formation of the doped mold film, the doped mold film may be formed such that the sum of the respective concentrations of the plurality of dopant species continuously decreases in a direction away from the substrate in a thickness direction of the doped mold film in the at least partial region of the doped mold film.

The formation of the doped mold film may include a step of supplying a silicon source to the substrate while supplying a plurality of dopant sources for providing a plurality of different dopant species to the substrate at flow rates that continuously decrease with respect to time. The formation of the capping mold film may include a step of supplying the silicon source without supplying a dopant source.

The formation of the hole may include a step of forming a preliminary hole of which a portion is defined by a doped mold pattern having a sidewall, which forms a first inclination angle with a plane surface that is parallel to a main surface of the substrate, by sequentially dry etching the support film, the capping mold film, and the doped mold film, and forming the hole of which a portion is defined by a doped mold having a sidewall, which forms a second inclination angle with the plane surface that is parallel to the main surface of the substrate, by wet etching an inner sidewall of the preliminary hole, wherein the second inclination angle is greater than the first inclination angle.

In an aspect, embodiments of the invention include an oxide film comprising at least one dopant species, wherein a dopant concentration gradient in the oxide film continuously varies in a thickness direction of the oxide film.

In some embodiments, the oxide film comprises a plurality of dopant species, and the sum of the concentrations of the plurality of dopant species continuously decreases from a bottom surface toward a top surface of the oxide film.

In some embodiments, the oxide film comprises a first dopant species and a second dopant species, and the oxide film also comprises a first thickness portion in which a concentration of the first dopant species varies in the thickness direction and a concentration of the second dopant species is constant in the thickness direction, and a second thickness portion in which a concentration of the first dopant species is constant in the thickness direction and a concentration of the second dopant species varies in the thickness direction.

In some embodiments, the oxide film includes a boro phospho silicate glass (BPSG) film, and the BPSG film comprises a first thickness portion in which a concentration of a dopant B varies in the thickness direction and a concentration of a dopant P is constant in the thickness direction, and a second thickness portion in which a concentration of the dopant B is constant in the thickness direction and a concentration of the dopant P varies in the thickness direction.

In some embodiments, a thickness of the first thickness portion of the oxide film is greater than a thickness of the second thickness portion.

In another aspect, embodiments of the invention include an integrated circuit (IC) device comprising: an insulating pattern formed on a substrate having a conductive region, the insulating pattern having a through hole exposing the conductive region; a first electrode protruding in a direction away from the substrate, from inside the through hole to above the insulating pattern; and a first support pattern extending in a direction perpendicular to the thickness direction, located at a first level, and spaced apart from the insulating pattern, the first support pattern being in contact with a first portion of the first electrode and supporting the first electrode, wherein the first electrode comprises: a first outer wall surface in contact with a sidewall of the insulating pattern exposed by the through hole; a second outer wall surface in contact with a top surface of the insulating pattern and extending in a lateral direction; and a third outer wall surface located on the insulating pattern and extending in a direction away from the substrate, wherein the third outer wall surface is spaced apart from the first outer wall surface, and the second outer wall surface is between the first outer wall surface and the third outer wall surface.

In an embodiment, the IC device comprises a first outer wall surface, a second outer wall surface, and a third outer wall surface of the first electrode which are sequentially connected and form a stepped outer wall surface.

In an embodiment, the IC device comprises a third outer wall surface that extends on the insulating pattern, in the direction away from the substrate, to a second level which is closer to the substrate than the first level.

In an embodiment, the IC device comprises a first electrode that further comprises a fourth outer wall surface extending from the third outer wall surface to the first level, in the direction away from the substrate, a reference angle is formed between the third outer wall surface and a plane surface that is parallel to a main surface of the substrate, a first inclination angle is formed between the fourth outer wall surface and the plane surface that is parallel to the main surface of the substrate, and the first inclination angle is smaller than the reference angle.

In an embodiment, the IC device comprises a fourth outer wall wherein the height of the fourth outer wall surface is smaller than a height of the third outer wall surface.

In an embodiment, the IC device further comprises a second support pattern extending in a direction perpendicular to the thickness direction and located at a third level that is farther from the insulating pattern than the first level, the second support pattern being in contact with a second portion of the first electrode spaced apart from the first portion of the first electrode and supporting the first electrode, wherein the first electrode further comprises a fifth outer wall surface that extends in the direction away from the substrate and is located at a level between the first level and the third level, and a second inclination angle is formed between the fifth outer wall surface and the plane surface that is parallel to the main surface of the substrate, wherein the second inclination angle is greater than the first inclination angle.

In an embodiment, the IC device comprises a fifth outer wall surface wherein the second inclination angle of the fifth outer wall surface is equal to the reference angle of the third outer wall surface.

In an embodiment, the IC device further comprises: a dielectric film in contact with the third outer wall surface;

and a second electrode facing the first electrode with the dielectric film interposed between the first electrode and the second electrode.

In an embodiment, the IC device further comprises a first electrode wherein the first electrode has a cylindrical shape defining an inner space of the first electrode.

In an embodiment, the IC device further comprises a first outer wall surface of the first electrode wherein a first width of a portion of the first outer wall surface of the first electrode, which is closest to the third outer wall surface, is at least 2 nm less than a second width of a portion of the third outer wall surface of the first electrode, which is closest to the first outer wall surface.

In an embodiment, the IC device further comprises a third outer wall surface wherein the third outer wall surface forms a right angle with the plane surface that is parallel to the main surface of the substrate.

In another aspect, embodiments of the invention include a method of forming an oxide film, the method comprising forming a doped oxide film on a substrate while continuously varying a flow rate of at least one dopant source being supplied to the substrate, wherein a dopant concentration gradient of the doped oxide film continuously varies in a thickness direction of the doped oxide film.

In an embodiment, the method includes a step of forming the doped oxide film which comprises forming the doped oxide film such that a dopant concentration continuously decreases in a thickness direction of the doped oxide film in a direction away from the substrate.

In an embodiment, the method includes a step of forming the doped oxide film which comprises supplying a plurality of dopant sources for providing a plurality of different dopant species to the substrate, wherein the total amount of the plurality of dopant sources supplied to the substrate continuously decreases during the forming of the doped oxide film.

In an embodiment, the method includes a step of forming the doped oxide film which comprises supplying a first dopant source to the substrate at a constant flow rate with respect to time while supplying a second dopant source, which is different from the first dopant source, to the substrate, wherein the second dopant source is supplied at a continuously decreasing flow rate of the second dopant source with respect to time.

In another aspect, embodiments of the invention include a method of manufacturing an integrated circuit (IC) device comprising: forming a doped mold film on the substrate while continuously varying a flow rate of at least one dopant source supplied to a substrate, the doped mold film having a dopant concentration gradient which continuously varies in a thickness direction of the doped mold film; forming a hole in the doped mold film by etching a portion of the doped mold film in the thickness direction; and forming an electrode which extends along an inner wall of the hole.

In an embodiment, the method includes a step of forming the doped mold film which comprises forming the doped mold film such that a dopant concentration continuously decreases in a direction away from the substrate in the thickness direction of the doped mold film.

In an embodiment, the method includes a step of forming the doped mold film which comprises supplying a plurality of dopant sources for providing a plurality of different dopant species to the substrate, wherein the total amount of the plurality of dopant sources supplied to the substrate continuously decreases during the forming of the doped mold film.

In an embodiment, the method includes a step of forming the doped mold film which comprises supplying a plurality of dopant sources for providing a plurality of different dopant species to the substrate, and also wherein the sum of the concentrations of the plurality of dopants included in the doped mold film continuously decreases in a direction away from the substrate in the thickness direction of the doped mold film.

In an embodiment, the method includes a step of forming the doped mold film which comprises supplying a first dopant source to the substrate at a constant flow rate with respect to time while supplying a second dopant source different from the first dopant source to the substrate, and also wherein a step of supplying the second dopant source comprises continuously decreasing the flow rate of the second dopant source with respect to time.

In an embodiment, the method includes a step of forming the doped mold film which comprises supplying a first dopant source for providing a first dopant species to the substrate and a second dopant source for providing a second dopant species different from the first dopant species to the substrate, wherein the sum of a concentration of the first dopant species and a concentration of the second dopant species in the doped mold film continuously decreases in a direction away from the substrate in the thickness direction of the doped mold film.

In an embodiment, the method includes a step of forming the doped mold film which comprises: a first operation of supplying a first dopant source for providing a first dopant species to the substrate while also supplying a second dopant source for providing a second dopant species different from the first dopant species to the substrate; and a second operation of supplying only one selected dopant source selected from the first dopant source and the second dopant source to the substrate.

In an embodiment, the method includes a first operation, wherein the first operation comprises continuously decreasing the sum of a first flow rate of the first dopant source and a second flow rate of the second dopant source with respect to time.

In an embodiment, the method includes a first operation, wherein the first operation comprises supplying the first dopant source at a first flow rate that is constant with respect to time and supplying the second dopant source at a second flow rate which is continuously decreased with respect to time.

In an embodiment, the method includes a second operation, wherein the second operation comprises supplying the selected dopant source to the substrate at a flow rate which is continuously decreased with respect to time.

In another aspect, embodiments of the invention include a method of manufacturing an integrated circuit (IC) device, the method comprising: forming a doped mold film on a substrate having a conductive region while continuously varying a flow rate of at least one dopant source supplied to the substrate, the doped mold film having a dopant concentration gradient which continuously varies in a thickness direction of the doped mold film; forming a capping mold film on the doped mold film; forming a support film on the capping mold film; forming a hole in the support film, the capping mold film, and the doped mold film by etching the support film, the capping mold film, and the doped mold film, the hole exposing the conductive region; and forming an electrode within the hole, the electrode having an outer sidewall facing a sidewall of the support film, a sidewall of the capping mold film, and a sidewall of the doped mold film, each of which is exposed within the hole.

In an embodiment, the method includes a step of forming the doped mold film which comprises forming the doped mold film such that a dopant concentration continuously decreases in a direction away from the substrate in the thickness direction of the doped mold film.

In an embodiment, the method includes a step of forming the doped mold film which comprises continuously decreasing the total amount of the at least one dopant source supplied to the substrate as the thickness of the doped mold film increases.

In an embodiment, the method includes a step of forming the doped mold film which comprises: forming a first doped mold film on the substrate such that a concentration of a first dopant species continuously decreases in a direction away from the substrate in the thickness direction of the first doped mold film; and forming a second doped mold film on the first doped mold film such that a concentration of a second dopant species different from the first dopant species continuously decreases in a direction away from the first doped mold film in the thickness direction of the second doped mold film.

In an embodiment, the method includes a step of forming the first doped mold film which comprises supplying a first dopant source for providing the first dopant species to the substrate at a first dopant source flow rate while also supplying a second dopant source for providing the second dopant species to the substrate at a constant flow rate with respect to time with respect to time, wherein the first dopant source flow rate is continuously decreased with respect to time.

In an embodiment, the method includes a step of forming the second doped mold film which comprises supplying a second dopant source at a flow rate which is continuously decreased with respect to time.

In an embodiment, the method includes a doped mold film wherein at least a partial region of the doped mold film includes a plurality of dopant species including different dopant elements, wherein the sum of the respective concentrations of the plurality of dopant species included in the doped mold film continuously decreases in a direction away from the substrate in the thickness direction of the doped mold film in at least the partial region of the doped mold film.

In an embodiment, the method includes a step of forming the doped mold film which comprises supplying a silicon source to the substrate while also supplying a plurality of dopant sources for providing a plurality of different dopant species to the substrate, wherein flow rates of the plurality of dopant sources are continuously decreased with respect to time, and also wherein the step of forming the capping mold film comprises supplying the silicon source without supplying a dopant source.

In an embodiment, the method includes a step of forming the hole which comprises: forming a preliminary hole by sequentially dry etching the support film, the capping mold film, and the doped mold film, wherein a portion of the preliminary hole is defined by a doped mold pattern, and a first inclination angle is formed between a sidewall of the doped mold pattern and a plane surface that is parallel to a main surface of the substrate; and forming the hole by wet etching an inner sidewall of the preliminary hole, wherein a portion of the hole is defined by a doped mold pattern, and a second inclination angle greater than the first inclination angle is formed between a sidewall of the doped mold pattern and the plane surface that is parallel to the main surface of the substrate.

In still another aspect, embodiments of the invention include a structure for use in fabricating at least one of the two electrodes comprising a capacitor for a semiconductor device, wherein the structure comprises: a substrate with a plurality of active regions that are defined by a plurality of isolation regions; a first insulating film formed on the substrate and having a plurality of conductive regions formed through the first insulating layer so as to be electrically connected to the active regions of the substrate; a second insulating film formed to cover the first insulating film and the conductive regions of the first insulating film; a first doped mold film formed on the second insulating film, wherein the first doped mold film has a dopant concentration gradient that varies smoothly and continuously from a higher dopant concentration closest to the substrate to a lower dopant concentration farthest from the substrate; and, a first undoped capping mold film formed on the first doped mold film.

In an embodiment, the structure includes a first doped mold film which comprises: a first doped mold film lower portion adjacent to the second insulating film, with a dopant concentration of a first dopant or a first dopant mixture that varies smoothly and continuously from a higher to a lower dopant concentration in a direction away from the substrate; and, a first doped mold film upper portion adjacent to the first capping mold film, with a dopant concentration of a second dopant or a second dopant mixture that varies smoothly and continuously from a higher to a lower dopant concentration in a direction away from the substrate.

In an embodiment, the structure further comprises: a first support film formed on the first capping mold film; a second mold film formed on the first support film; a second support film formed on the second mold film; and, a sacrificial film and mask pattern formed sequentially on the second support film.

In an embodiment, the structure has been etched using the mask pattern so as to form a plurality of holes that penetrate sequentially through the sacrificial film, the second support film, the second mold film, the first support film, the capping mold film and the doped mold film to expose the second insulating film.

In an embodiment, the structure further comprises: a first support film formed on the first capping mold film; a second doped mold film formed on the first support film, wherein the second doped mold film has a dopant concentration gradient that varies smoothly and continuously from a higher dopant concentration closest to the substrate to a lower dopant concentration farthest from the substrate; and, a second capping mold film formed on the second doped mold film.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
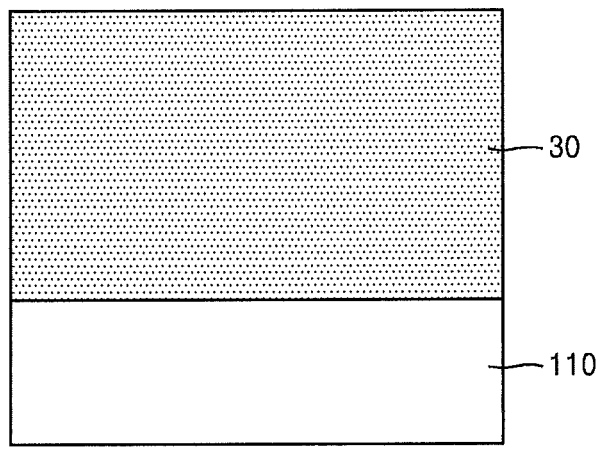
FIGS. 1A to 1D are cross-sectional views illustrating process operations of a method of forming an oxide film according to exemplary embodiments.
Figure 1A:
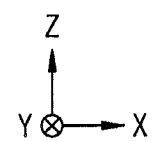

As used herein, the term "and/or" includes any and all combinations of one or more of the associated listed items. Expressions such as "at least one of," when preceding a list of elements, modify the entire list of elements and do not modify the individual elements of the list.

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. The same reference numerals are used to denote the same elements, and repeated descriptions thereof are omitted.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. As used herein, the term "and/or" includes any and all combinations of one or more of the associated listed items. When the term "substrate" is used herein, it may be understood as either the substrate itself, or both the substrate and a stacked structure including a predetermined layer/film formed on a surface of the substrate. Also, when the expression "surface of the substrate" is used herein, it may be understood as either an exposed surface of the substrate itself or an outer surface of a predetermined layer/film formed on the substrate. When the term "dopant concentration gradient" is used herein, it may be understood as the amount of a dopant in a mixture with a unit volume. The mixture may broadly refer to a mixture including a gaseous mixture, a solid mixture, and a liquid mixture.

FIGS. 1A to 1D are cross-sectional views of process operations of a method of forming an oxide film according to exemplary embodiments.

Referring to FIG. 1A, a doped oxide film 30 containing at least one dopant species may be formed on a substrate 110. The at least one dopant species may be distributed at a variable concentration in a thickness direction (Z direction) such that the doped oxide film 30 has a dopant concentration gradient that continuously varies from a higher to a lower concentration in the thickness direction.

The substrate 110 may be a semiconductor substrate. In some embodiments, the substrate 110 may be formed of a semiconductor, such as silicon (Si) or germanium (Ge). In some other embodiments, the substrate 110 may include a compound semiconductor, such as silicon germanium (SiGe), silicon carbide (SiC), gallium arsenide (GaAs), indium arsenide (InAs), or indium phosphide (InP). In some other embodiments, the substrate 110 may have a silicon-on-insulator (SOI) structure. The substrate 110 may include a conductive region, for example, a doped well or a doped structure (not shown in FIG. 1A).

The doped oxide film 30 may be formed by using a thermal chemical vapor deposition (CVD) process or a plasma CVD process.

In an exemplary process for forming the doped oxide film 30, the at least one dopant source, a silicon source, and an oxygen source may be supplied together to the substrate 110, while continuously varying a flow rate of the at least one dopant source supplied to the substrate 110 from a higher to a lower flow rate. Thus, the doped oxide film 30 may be formed on the substrate 110 such that a dopant concentration gradient in the doped oxide film 30 continuously varies from a higher to a lower concentration in a thickness direction (Z direction).

In some embodiments, the doped oxide film 30 may be a boro phospho silicate glass (BPSG) layer. To form the doped oxide film 30 using BPSG, a silicon (Si) source, an oxygen source, and at least one dopant source may be supplied into a chamber maintained at a temperature of about 300° C. to about 600° C. under a pressure of about 5 torr to about 400 torr.

In some embodiments, the silicon source for the doped oxide film 30 may be tetra ethyl ortho silicate (TEOS), tris(dimethylamino)silane ($Si(N(CH_3)_2)_3H$, hereinafter abbreviated to: (3DMAS), tetrakis(dimethylamino)silane ($Si(N(CH_3)_2)_4$, hereinafter abbreviated to: (4DMAS), bis(diethylamino)silane ($Si(N(C_2H_5)_2)_2H_2$, hereinafter abbreviated to: (2DEAS), bis(tertiarybutylamino)silane ($SiH_2(NH(C_4H_9))_2$, hereinafter abbreviated to: (BTBAS), tetrachlorosilane ($SiCl_4$), hereinafter abbreviated to: (TCS), dichlorosilane ($SiH_2Cl_2$), hereinafter abbreviated to (DCS), monosilane ($SiH_4$), or hexachlorodisilane ($Si_2Cl_6$), hereinafter abbreviated to: (HCD).

The at least one dopant source for the doped oxide film 30 may include a boron (B) source, a phosphorus (P) source, or a combination thereof.

The boron source for the doped oxide film 30 may include triethylborate (TEB) or trimethylborate (TMB). The phosphorus source may include triethylphosphate (TEPO), triethylphosphite (TEPi), trimethylphosphate (TMPO), or trimethylphosphite (TMPi).

The oxygen source for the doped oxide film 30 may be $O_2$ and/or $O_3$.

To form the doped oxide film 30, a supply flow rate of a dopant supplied from a supply device configured to supply a dopant source may be controlled to continuously vary a flow rate of at least one dopant source that is being supplied to the substrate 110. In some embodiments, to continuously increase a flow rate of at least one source of a B source and a P source supplied to the substrate 110, supply flow rates of the B source and/or the P source supplied from a boron (B) source supply device and/or a phosphorus (P) source supply device may be controlled to gradually increase or decrease at predetermined time intervals of about 1 second or less. For example, a variation of the supply flow rate of the B source and/or the P source may vary within the range of about −50 mgm/sec to about +50 mgm/sec. In this case, each of the silicon source and the oxygen source may be supplied at a constant flow rate with respect to time. Thus, a supply flow rate of a dopant source from the B source supply device and/or the P source supply device may be controlled at sufficiently short time intervals of about 1 second or less. As a result, dopant sources which provide dopant amounts to the substrate 100 that are continuously varied may participate in the formation of the doped oxide film 30.

The doped oxide film 30 may be formed to a thickness of about from 1000 Å to about 20000 Å, but is not limited thereto.

Figure 1B:
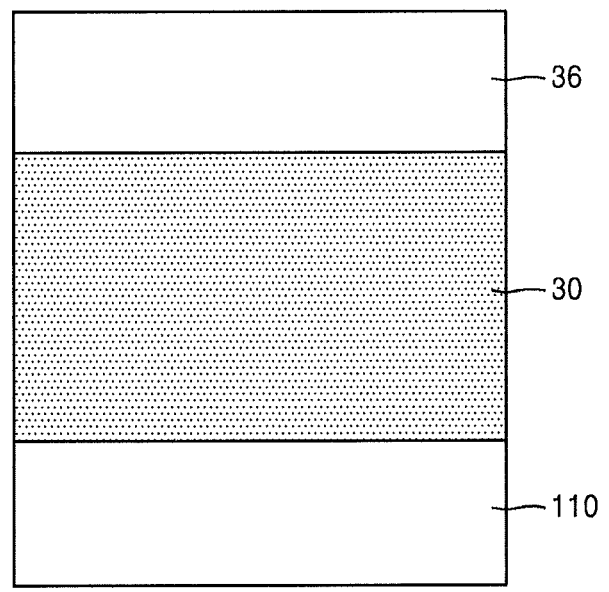
Figure 1B:
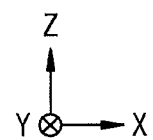

Referring to FIG. 1B, a capping oxide film 36 may be formed on the doped oxide film 30.

The capping oxide film 36 may be formed by using a thermal CVD process or a plasma-enhanced CVD (PECVD) process.

In some embodiments, the capping oxide film 36 may be an undoped silicate glass (USG) film.

The process of forming the capping oxide film 36 may be continuously performed in-situ in the same chamber as a chamber used to form the doped oxide film 30 after forming the doped oxide film 30.

In some embodiments, after the formation of the doped oxide film 30 formed of BPSG is completed, the capping oxide film 36 may be formed while interrupting the further supply of dopant from the dopant source, while continuing the supply of silicon from a silicon source and the supply of oxygen from an oxygen source. Thus, the capping oxide film 36 may not contain a dopant.

To form the capping oxide film 36, silicon from a silicon source and oxygen from an oxygen source may be supplied into a chamber maintained at a temperature of about 300° C. to about 600° C. under a pressure of about 5 torr to about 400 torr.

The silicon source for forming the capping oxide film 36 may include the same material as, or a different material from, the silicon source used to form the doped oxide film 30.

The capping oxide film 36 may be formed to a thickness of from about 500 Å to about 2000 Å, but is not limited thereto.

Figure 2A:
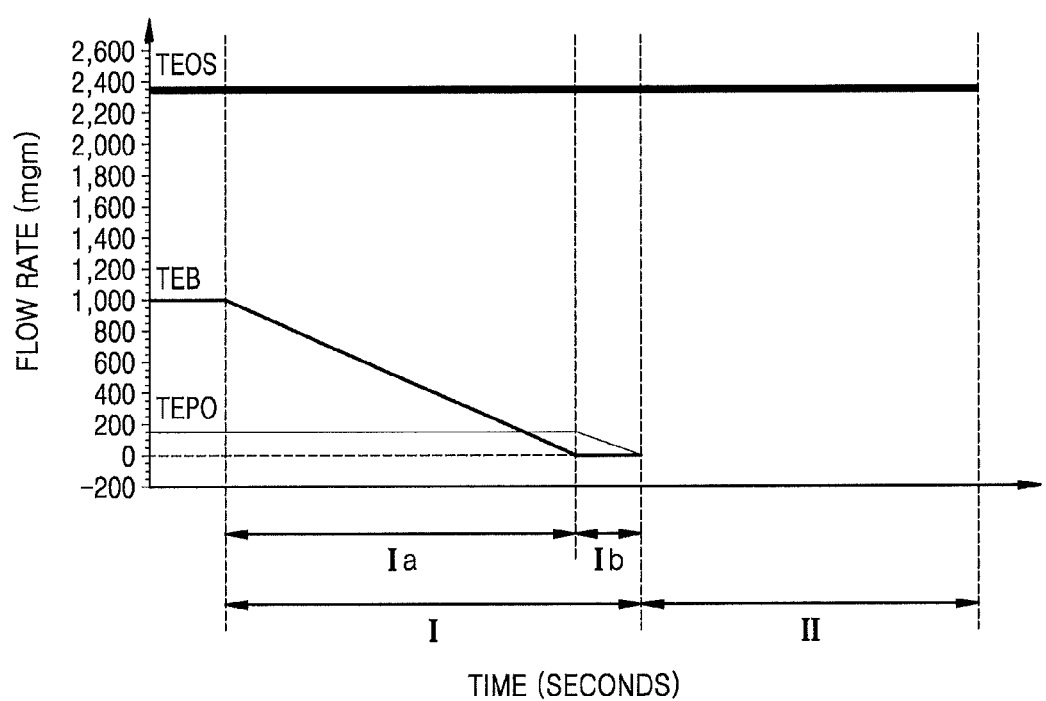
FIGS. 2A and 2B are graphs showing variations in supply flow rates of dopant sources in a method of forming an oxide film according to exemplary embodiments.
Figure 2B:
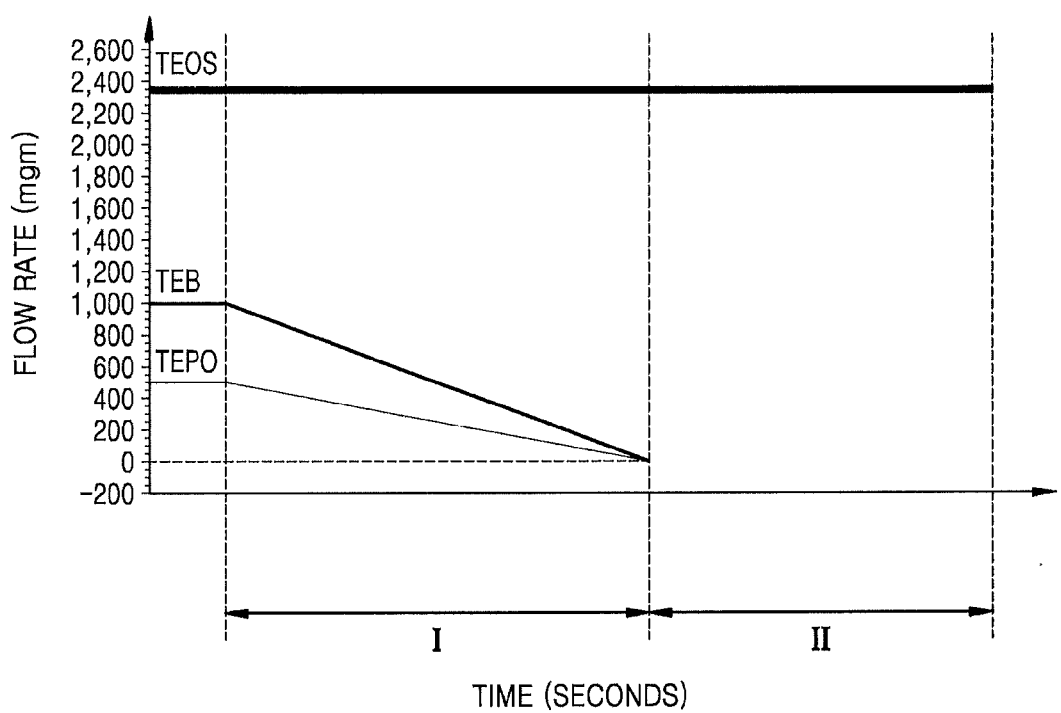

FIGS. 2A and 2B are graphs showing variations in supply flow rates of exemplary sources for sequentially forming a BPSG doped oxide film 30 and a USG capping oxide film 36 in a method of forming an oxide film according to exemplary embodiments.

Specifically, FIG. 2A is a graph showing variations in flow rates of a silicon source and dopant sources in a method of forming an oxide film according to exemplary embodiments.

FIG. 2A shows variations in flow rates of TEOS, TEB, and TEPO during the formation of the doped oxide film 30 and the capping oxide film 36 when TEOS is used as the silicon source and TEB and TEPO are used as the dopant sources to form the doped oxide film 30 and the capping oxide film 36 described with reference to FIGS. 1A and 1B.

Referring to FIG. 2A, in an operation I of forming the doped oxide film 30, the doped oxide film 30 may be formed to have a concentration gradient such that a concentration of any one of dopants B and P continuously decreases in a direction away from the substrate 110 in a thickness direction (Z direction in FIG. 1A) of the doped oxide film 30.

The operation I for forming the doped oxide film 30 may include a first operation Ia and a second operation Ib of supplying dopants by using different methods.

In the first operation Ia, TEB for providing a dopant B to the substrate 110 and TEPO for supplying a dopant P to the substrate 110 may be supplied together. In the first operation Ia, where TEB serves as a dopant B source and TEPO serves as a dopant P source, TEB may be supplied at a continuously reduced flow rate with respect to time, while TEPO may be supplied at a constant flow rate with respect to time. Accordingly, in the first operation Ia, the doped oxide film 30 may be formed to have a concentration gradient such that a concentration of the dopant B of the dopants B and P continuously decreases in a direction away from the substrate 110 in a thickness direction (Z direction in FIG. 1A) of the doped oxide film 30.

In the second operation Ib, only TEPO of the dopant sources may be supplied to the substrate 110, and a flow rate of the TEPO may continuously decrease with respect to time. Accordingly, in the second operation Ib, the doped oxide film 30 may be formed to have a concentration gradient such that a concentration of the dopant P of the dopants B and P continuously decreases in a direction away from the substrate 110 in a thickness direction (Z direction in FIG. 1A) of the doped oxide film 30.

In the first operation Ia and the second operation Ib, the sum of a flow rate of TEB and a flow rate of TEPO may continuously decrease with respect to time.

In the operation I of forming the doped oxide film 30, an initial flow rate of TEB may be different from an initial flow rate of TEPO. As shown in FIG. 2A, the initial flow rate of TEB may be larger than the initial flow rate of TEPO. In the first operation Ia of the operation I of forming the doped oxide film 30, TEB, for which the initial flow rate is relatively large, may be supplied at a continuously reduced flow rate with respect to time, while a flow rate of TEPO, for which the initial flow rate is relatively small, may be maintained at a constant flow rate of more than 0 milligrams per minute (mgm) with respect to time. In the first operation Ia, the flow rate of TEB may continuously decrease so as to reach about 0 mgm with respect to time at the conclusion of operation Ia.

In the second operation Ib, TEB may not be supplied, while the flow rate of TEPO may continuously decrease so as to reach about 0 mgm with respect to time at the conclusion of operation Ib.

In the first operation Ia of the operation I for forming the doped oxide film 30, both TEB and TEPO may be supplied to the substrate 110. In the first operation Ia, the total amount of TEB and TEPO supplied to the substrate 110 may continuously decrease during the formation of the doped oxide film 30. Thus, the sum of the concentrations of the dopants B and P contained in the doped oxide film 30 may continuously decrease in a direction away from the substrate 110 in a thickness direction (Z direction in FIG. 1A) of the doped oxide film 30.

FIG. 2A illustrates a case in which the flow rate of only one of TEB and TEPO continuously decreases with respect to time in each of the first operation Ia and the second operation Ib of the operation I for forming the doped oxide film 30. However, the inventive concept is not limited thereto. In the first operation Ia and in the second operation Ib, each of two different dopant sources may be supplied at a continuously reduced flow rate with respect to time.

In FIG. 2A, in the operation II for forming the capping oxide film 36, a flow rate of TEOS may be maintained constant to be equal to the flow rate of TEOS in the operation I for forming the doped oxide film 30, while during operation II TEB and TEPO may not be supplied.

FIG. 2B is a graph showing variations in a silicon source and dopant sources in a method of forming an oxide film according to another exemplary embodiment.

FIG. 2B shows another example of variations in flow rates of TEOS, TEB, and TEPO during the formation of the doped oxide film 30 and the capping oxide film 36 when TEOS is used as the silicon source and TEB and TEPO are used as the dopant sources to form the doped oxide film 30 and the capping oxide film 36 described with reference to FIGS. 1A and 1B.

Referring to FIG. 2B, in an operation I of forming the doped oxide film 30, the doped oxide film 30 may be formed to have a concentration gradient such that a concentration of each of dopants B and P continuously decreases in a direction away from the substrate 110 in a thickness direction (Z direction in FIG. 1A) of the doped oxide film 30.

In the operation I for forming the doped oxide film 30, TEB, which provides the dopant B to the substrate 110, and TEPO, which provides the dopant P to the substrate 110, may be supplied together, and a concentration of each of the supplies of TEB and TEPO may continuously decrease with respect to time. Thus, the sum of the flow rates of TEB and TEPO may continuously decrease with respect to time.

In the operation I for forming the doped oxide film 30, a flow rate of each of TEB and TEPO may continuously decrease from an initial flow rate thereof so as to reach about 0 mgm with respect to time at the conclusion of operation I.

In the operation I for forming the doped oxide film 30, the initial flow rate of TEB may be different from the initial flow rate of TEPO. Although FIG. 2B illustrates a case in which the initial flow rate of TEB is higher than the initial flow rate of TEPO, the inventive concept is not limited thereto. For example, the initial flow rate of TEPO may be higher than the initial flow rate of TEB or equal to the initial flow rate of TEB.

In the operation I for forming the doped oxide film 30, the total amount of TEB and TEPO supplied to the substrate 110 may continuously decrease during the formation of the doped oxide film 30. Thus, a concentration of each of the dopants B and P included in the doped oxide film 30 may continuously decrease in a direction away from the substrate 110 in a thickness direction (Z direction in FIG. 1A) of the doped oxide film 30.

In FIG. 2B, the operation II for forming the capping oxide film 36 may be the same as the operation II described with reference to FIG. 2A.

FIG. 2B illustrates a case in which a ratio of the initial flow rate of TEB relative to the initial flow rate of TEPO is a ratio of about 2:1 in the operation I for forming the doped oxide film 30, but the inventive concept is not limited thereto. For example, in the operation I for forming the doped oxide film 30, a ratio of the initial flow rate of TEB relative to the initial flow rate of TEPO may be selected to be in the range of about 1:9 to about 9:1.

FIGS. 2A and 2B illustrate examples in which the doped oxide film 30 has a concentration gradient such that a concentration of at least one of the dopants B and P continuously decreases in a direction away from the substrate 110 in the thickness direction (Z direction in FIG. 1A) of the doped oxide film 30, but the inventive concept is not limited to the examples shown in FIGS. 2A and 2B. In another example, the doped oxide film 30 may be formed to have a concentration gradient such that the concentration of at least one of the dopants B and P continuously increases in a direction away from the substrate 110 in the thickness direction (Z direction in FIG. 1A) of the doped oxide film 30. In still another example, the doped oxide film 30 may be formed to have a concentration gradient such that the concentration of at least one of the dopants B and P continuously increases in a direction away from the substrate in a selected partial section in the thickness direction (Z direction in FIG. 1A) of the doped oxide film 30, and the concentration of the at least one of the dopants B and P continuously decreases in a direction away from the substrate 110 in another selected partial section in the thickness direction (Z direction in FIG. 1A) thereof. A method of varying a concentration gradient of a dopant in the doped oxide film 30 may be variously modified within the scope of the inventive concept.

Figure 1C:
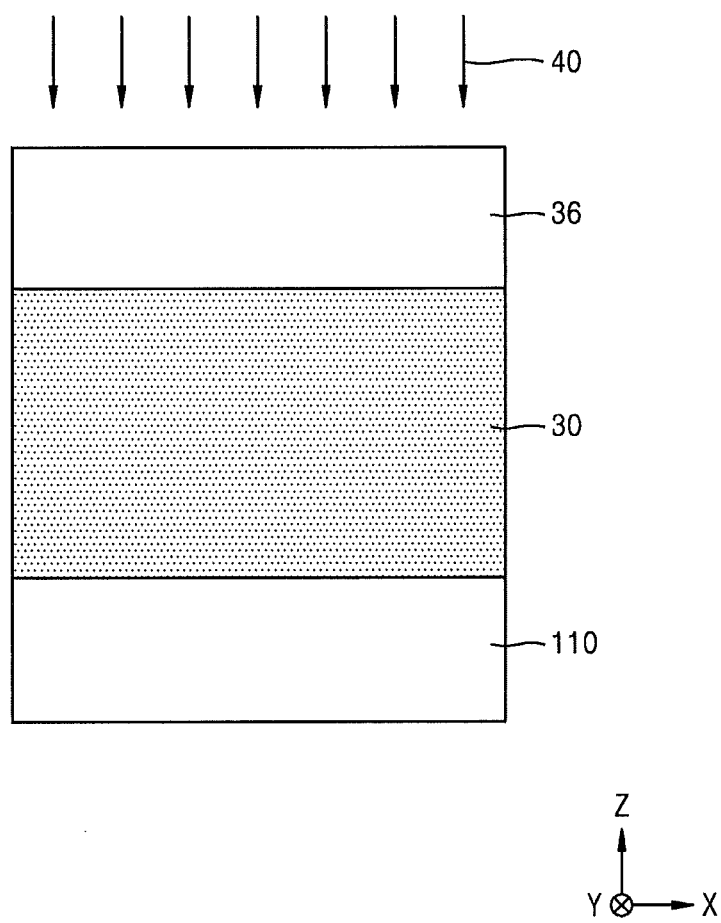

Referring next to FIG. 1C, a resultant structure in which the doped oxide film 30 and the capping oxide film 36 are formed may be treated by heat 40 by using the same method as described with reference to FIGS. 2A and 2B.

To perform the heat treatment (40), a rapid thermal annealing (RTA) process may be performed at a temperature of about 800° C. to about 1200° C., and thereafter an annealing process may be performed at a temperature of about 500° C. to about 800° C. These heat treatments may be sequentially performed.

An annealing temperature may be boosted at a rate of about 20° C. to about 40° C. per second until the annealing temperature reaches a desired annealing temperature of, for example, about 900° C. to about 1100° C., and this RTA process may be performed for about one hour at the desired annealing temperature. In some embodiments, the RTA process may be performed in the atmosphere of steam formed by a reaction of $H_2$ with $O_2$ while supplying $H_2$ and $O_2$.

After the RTA process is performed, the annealing process may be performed in an $N_2$ or $O_2$ atmosphere for about 2 seconds to 10 minutes.

The reflowing of the doped oxide film 30 may be caused by the heat (40) treatment. Outgassing from inside the doped oxide film 30 may occur to densify the doped oxide film 30.

After the heat treatment (40), a temperature of the substrate 110 may be gradually lowered in a vacuum atmosphere.

Figure 1D:
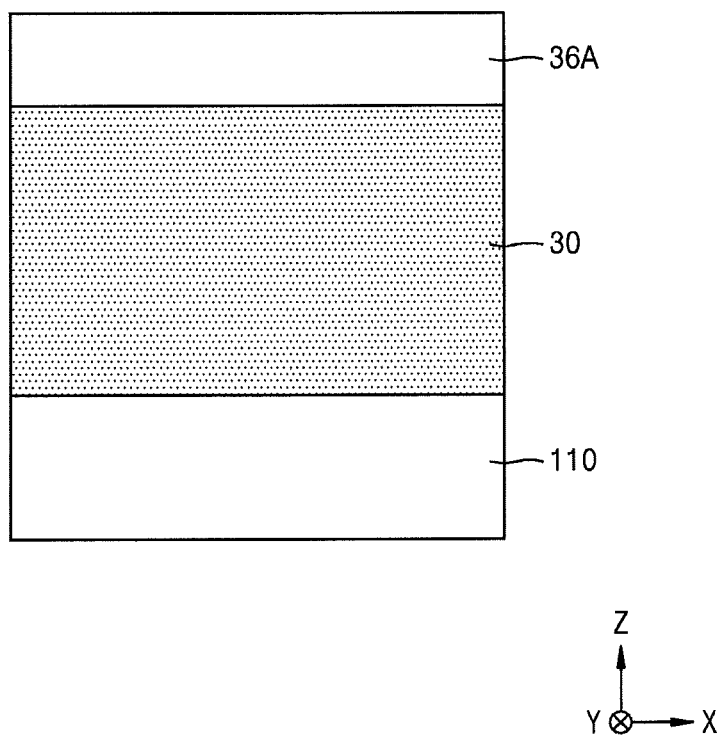

Referring to FIG. 1D, a top surface of a predetermined thickness of the capping oxide film 36 may be removed from the annealed resultant structure as described with reference to FIG. 1C so that a planarized capping silicon oxide film 36A may remain on the doped oxide film 30.

In some embodiments, a final thickness of the planarized capping silicon oxide film 36A may range from about 500 Å to about 2000 Å, but the inventive concept is not limited thereto.

A chemical mechanical polishing (CMP) process may be used to remove the predetermined thickness of the capping oxide film 36 from the top surface thereof, but the inventive concept is not limited thereto.

Figure 3A:
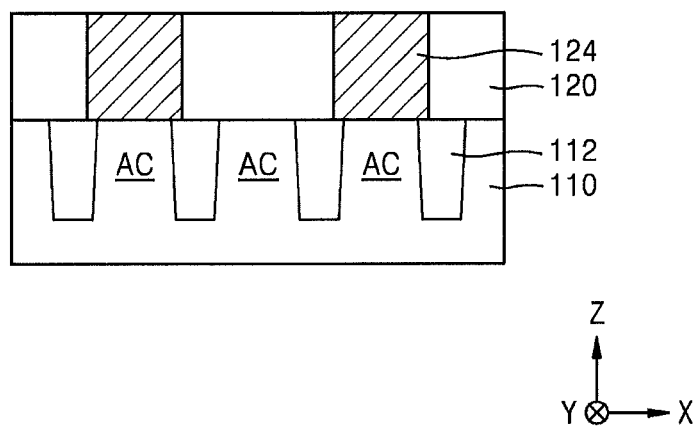
FIGS. 3A to 3N are cross-sectional views illustrating process operations of a method of manufacturing an integrated circuit (IC) device according to exemplary embodiments.
Figure 3B:
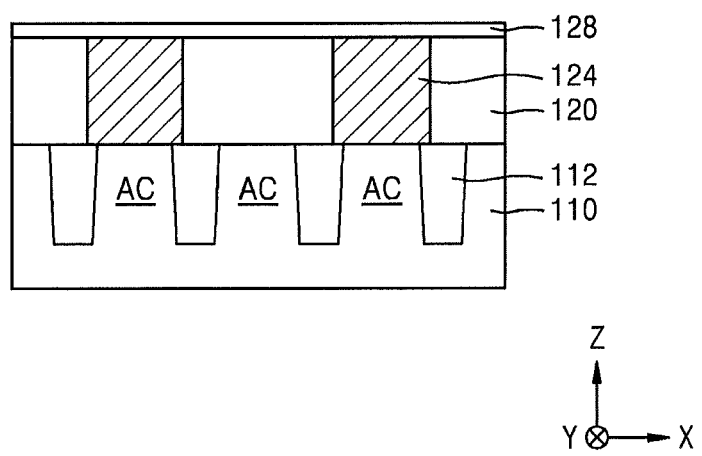
Figure 3C:
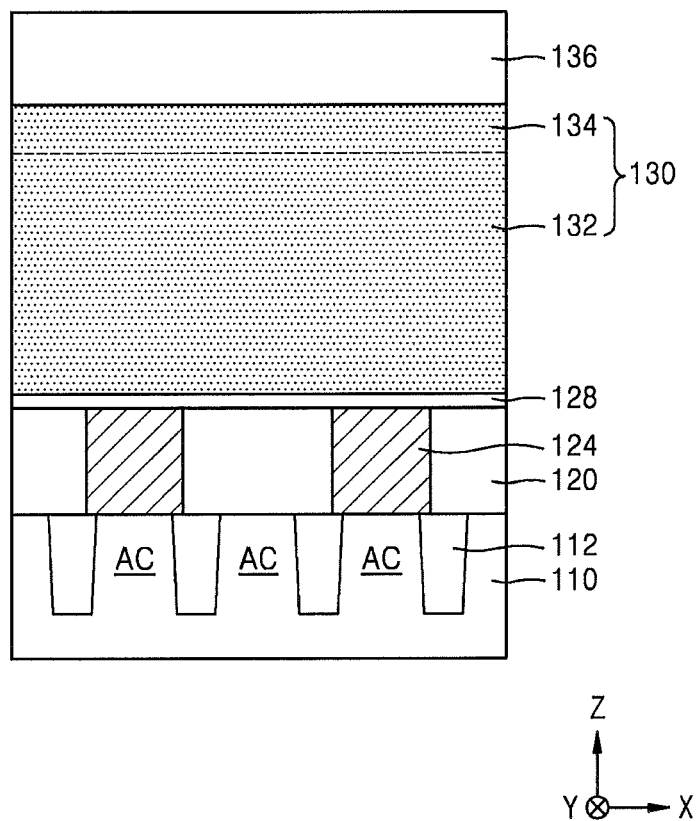
Figure 3D:
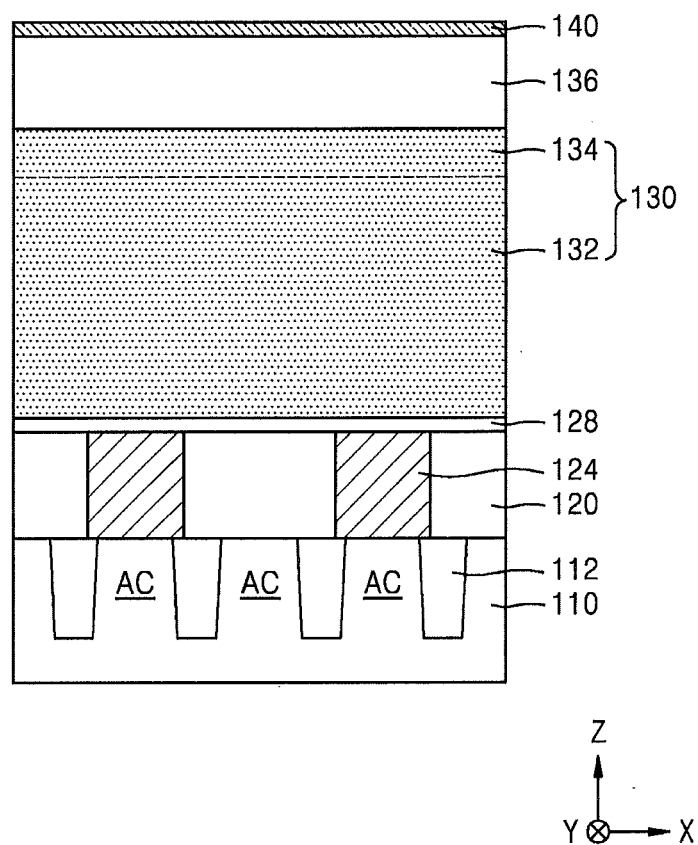
Figure 3E:
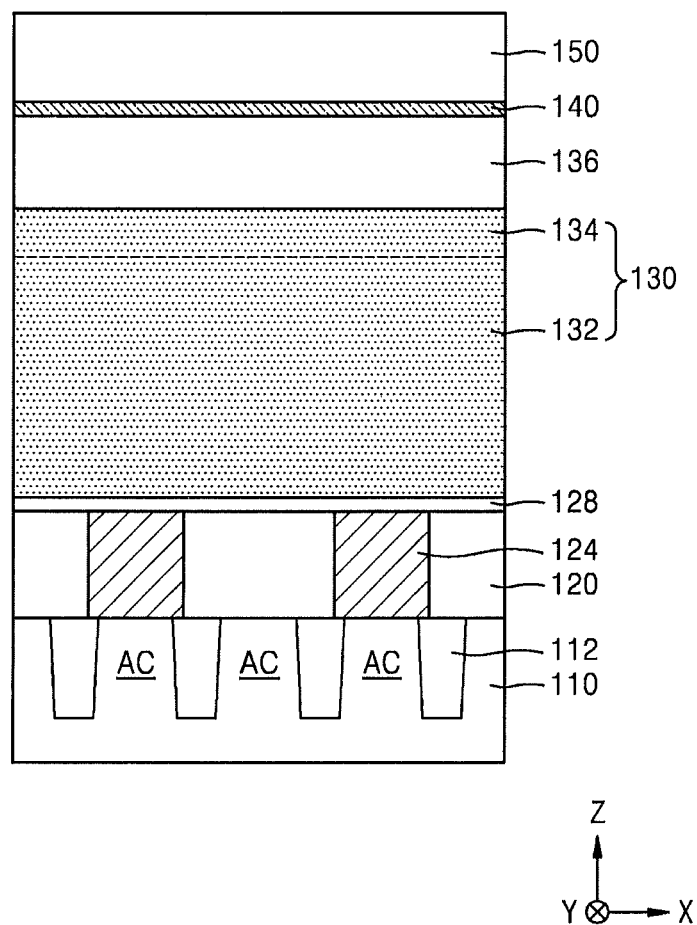
Figure 3F:
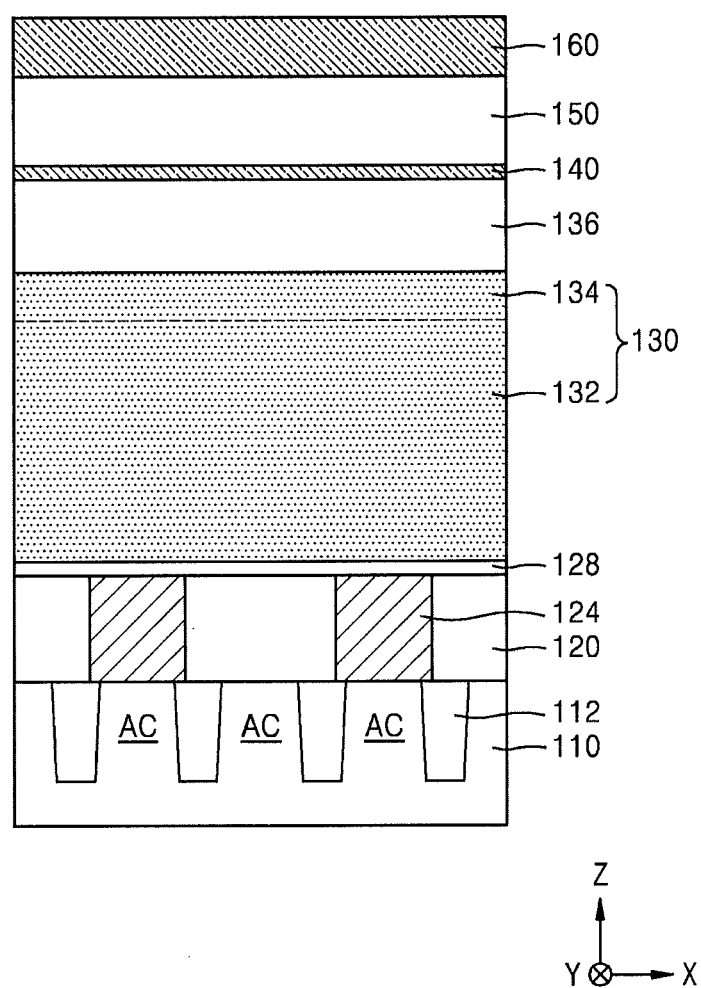
Figure 3G:
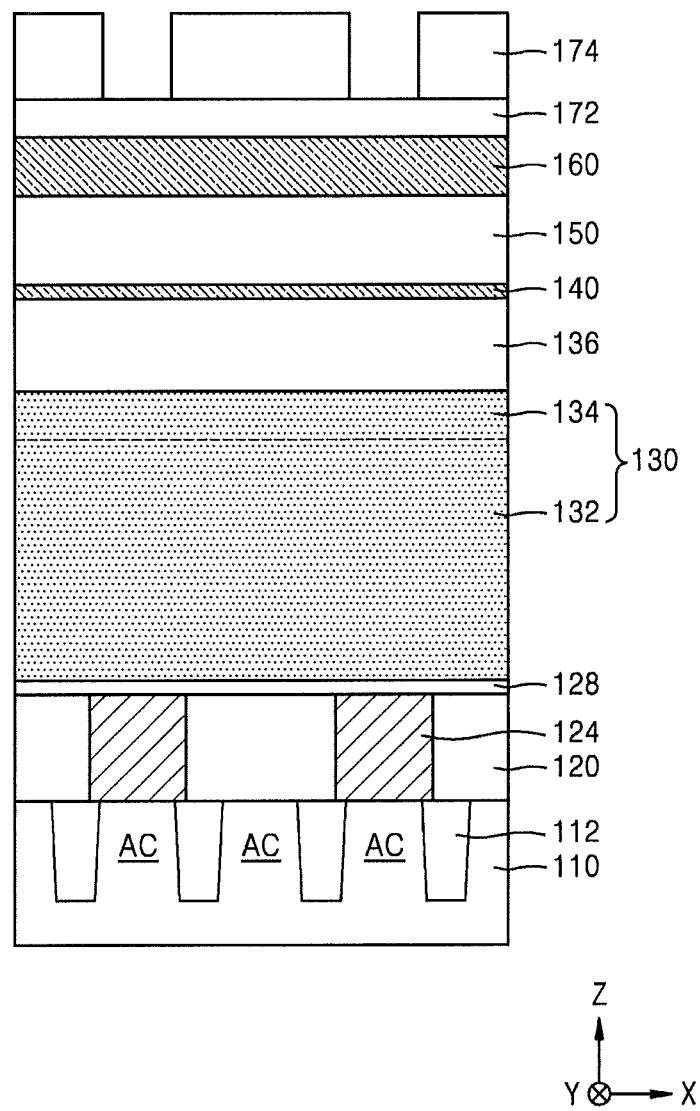
Figure 3H:
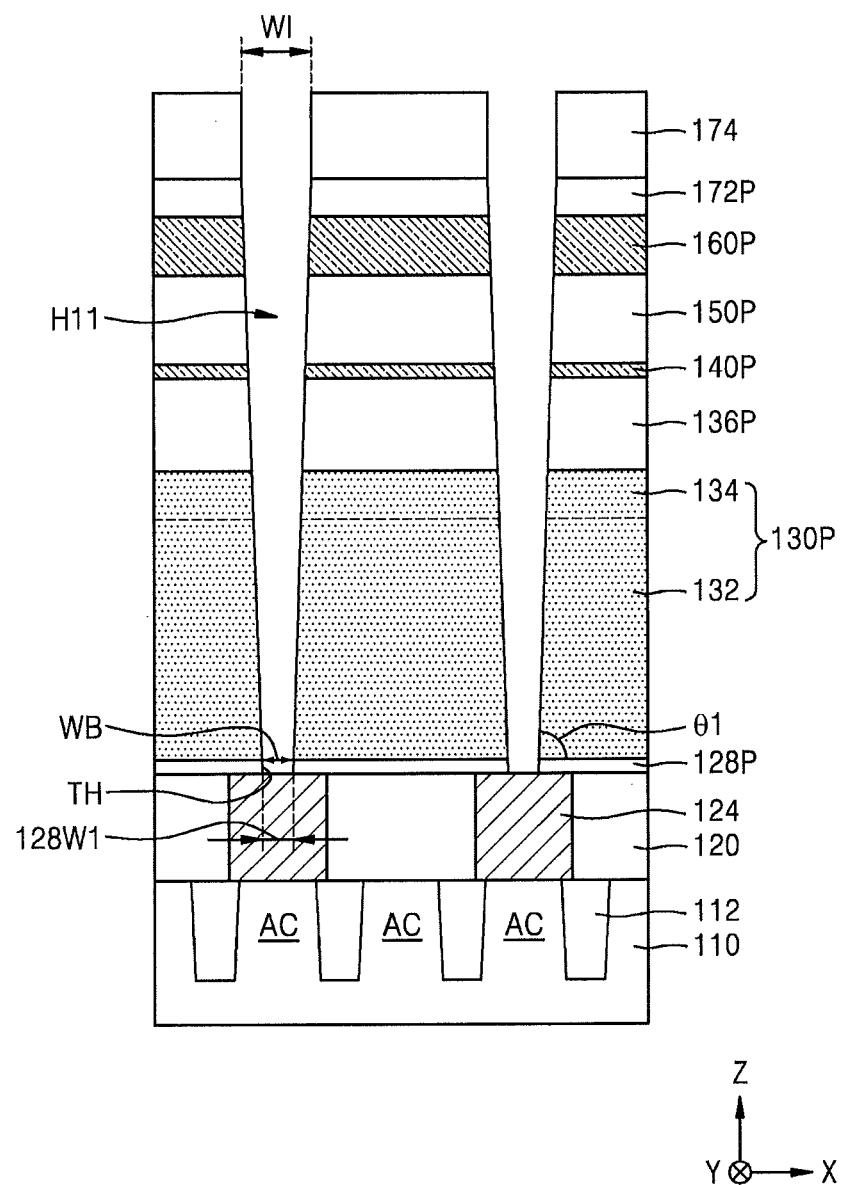
Figure 3I:
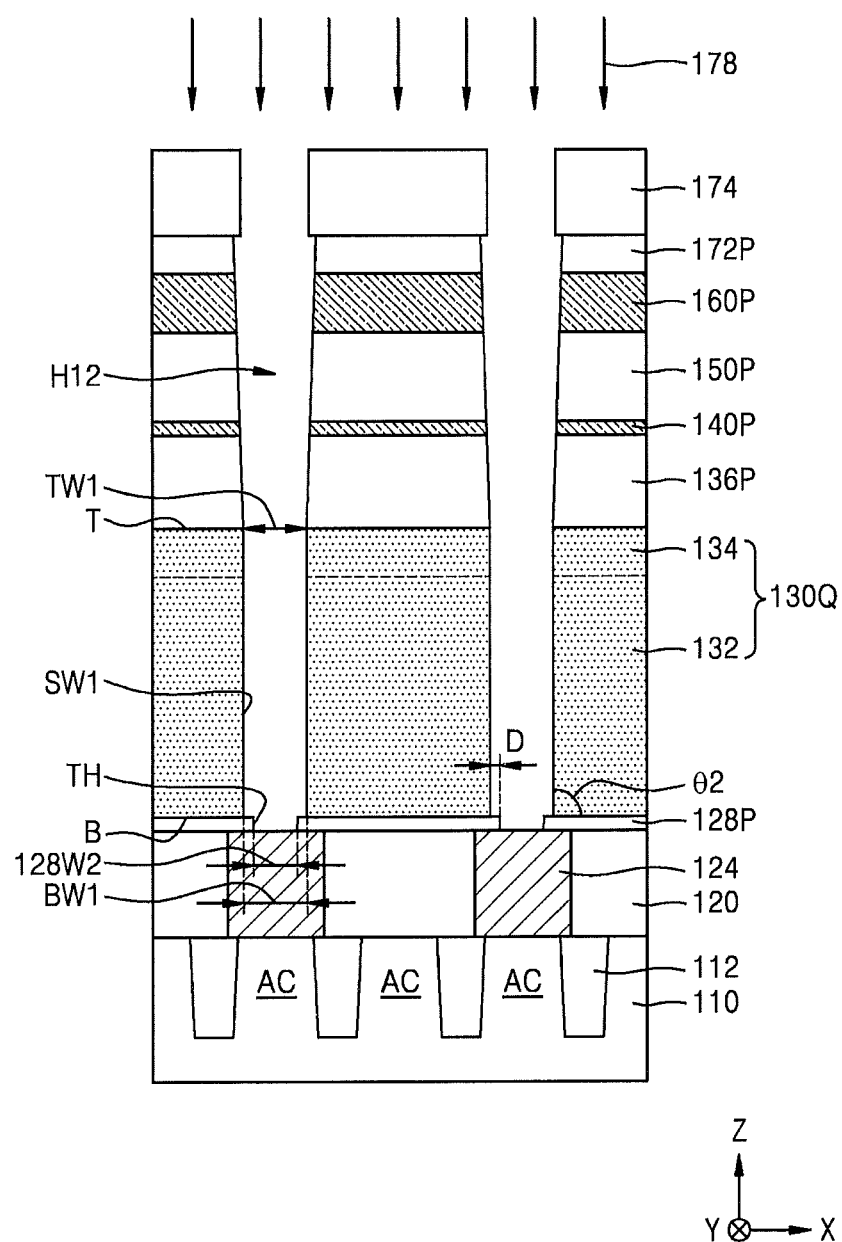
Figure 3J:
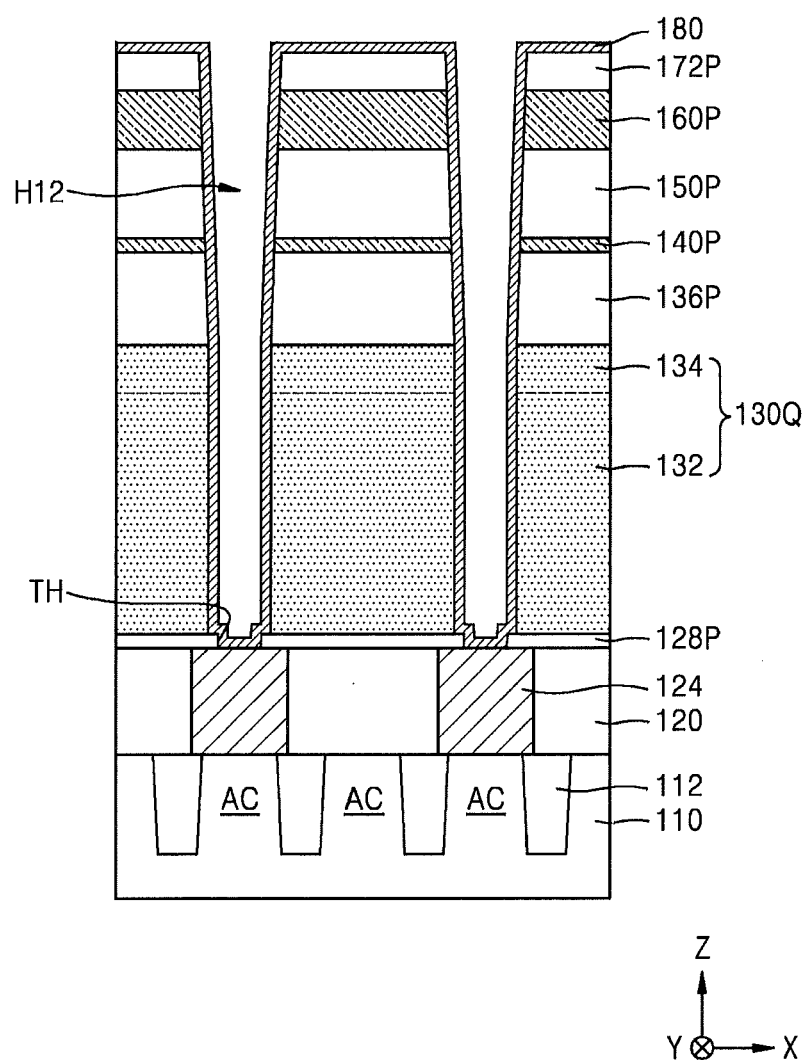
Figure 3K:
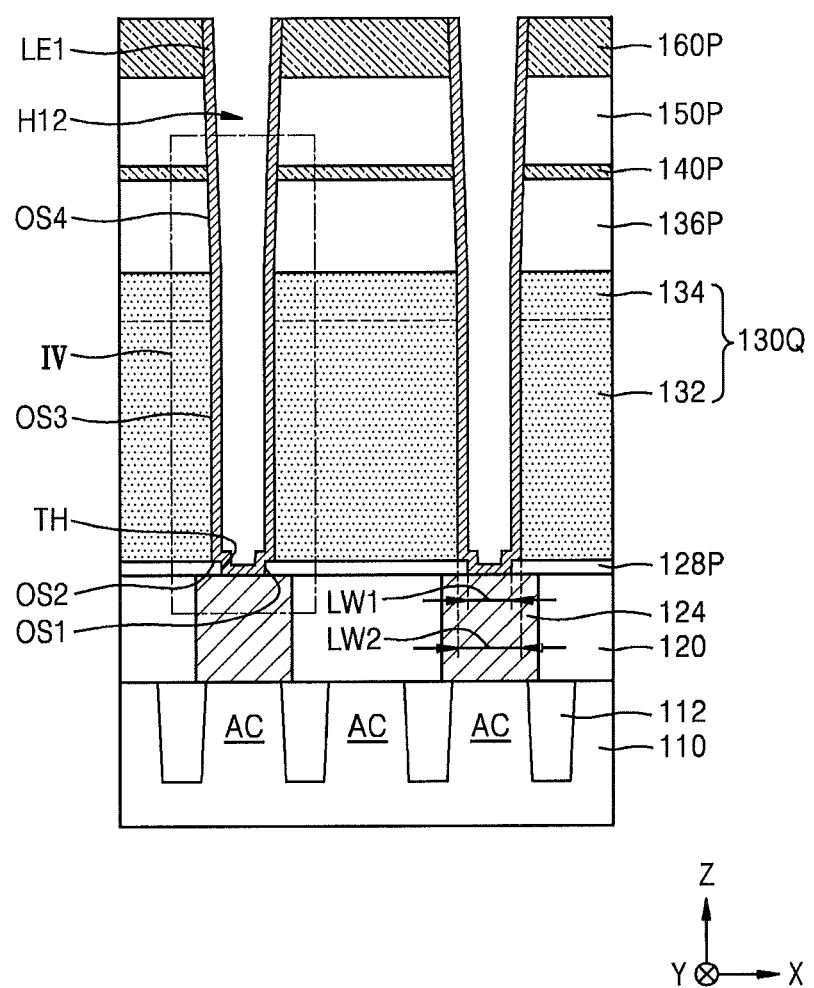
Figure 3L:
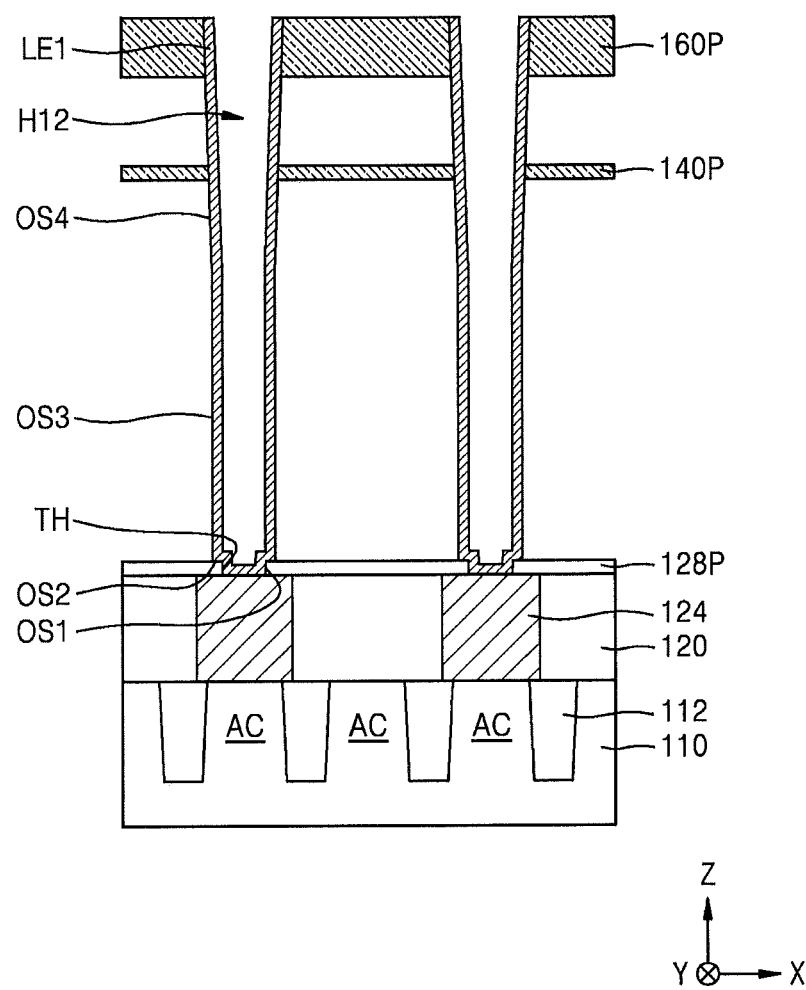
Figure 3M:
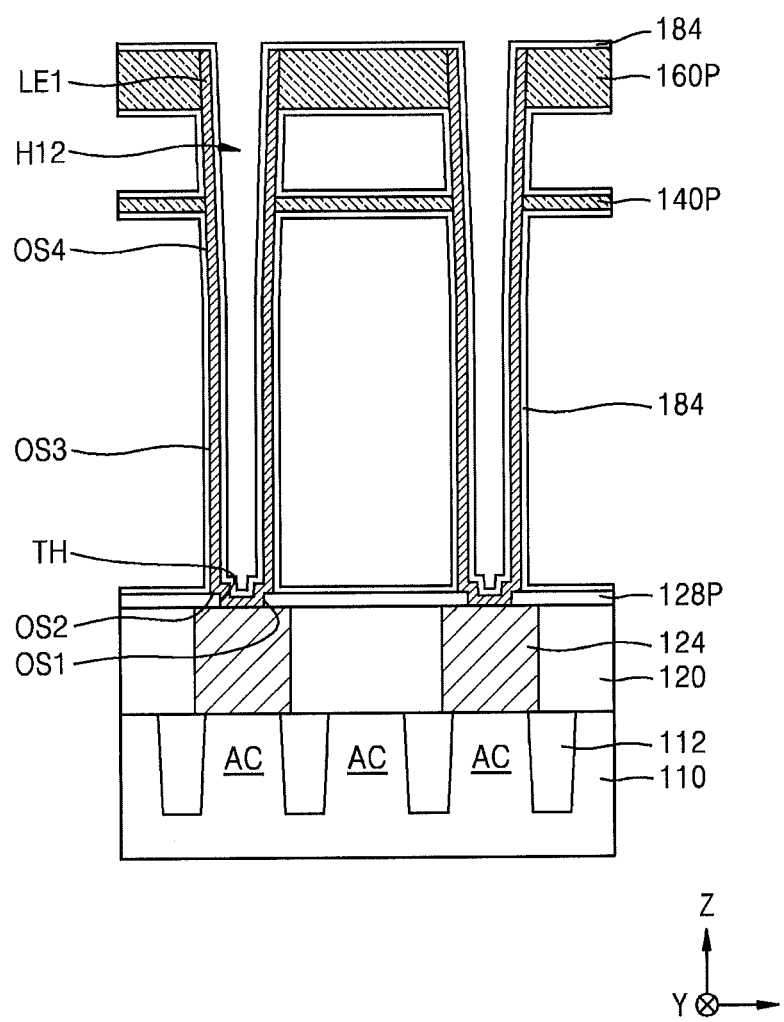
Figure 3N:
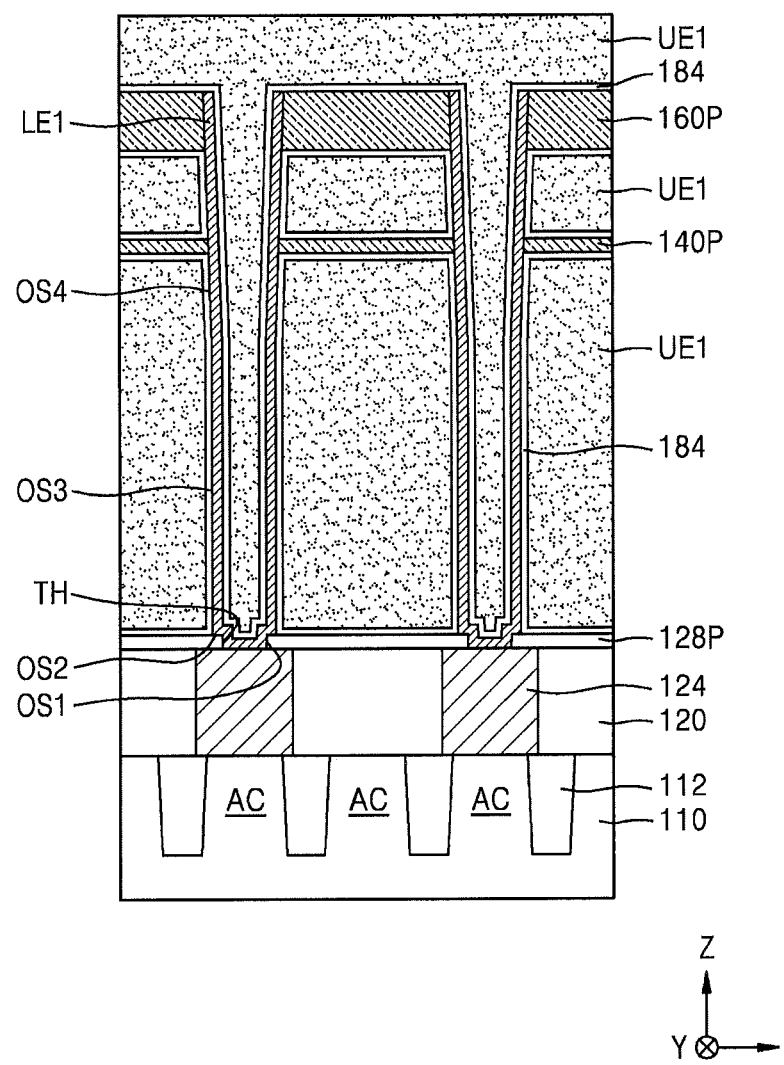

FIGS. 3A to 3N are cross-sectional views illustrating process operations for a method of manufacturing an IC device 100 (refer to FIG. 3N) according to exemplary embodiments. In FIGS. 3A to 3N, the same reference numerals are used to denote the same elements as in FIGS. 1A to 1D, and detailed descriptions thereof are omitted.

Referring to FIG. 3A, an interlayer insulating film 120 may be formed on a substrate 110 that includes a plurality of active regions AC, and then a plurality of conductive regions 124 may be formed through the interlayer insulating film 120 and connected to the plurality of active regions AC.

The plurality of active regions AC may be defined by a plurality of isolation regions 112 formed in the substrate 110. Each isolation region 112 may include a silicon oxide film, a silicon nitride film, a silicon oxynitride film, or a combination thereof.

The interlayer insulating film 120 may be a silicon oxide film.

The plurality of conductive regions 124 may be connected to one terminal of a switching device (not shown) (e.g., a field-effect transistor (FET)) formed on the substrate 110. The plurality of conductive regions 124 may include polysilicon (poly-Si), a metal, a conductive metal nitride, a metal silicide, or a combination thereof.

Referring to FIG. 3B, an insulating film 128 may be formed to cover the interlayer insulating film 120 and the plurality of conductive regions 124. The insulating film 128 may be used as an etch stop layer.

The insulating film 128 may be formed of an insulating material having an etch selectivity with respect to the interlayer insulating film 120. A mold structure (which may comprise a doped mold film 130, a capping mold film 136, and an upper mold film 150 as shown in FIG. 3G) will be formed on insulating film 128 in subsequent processes. In some embodiments, the insulating film 128 may be formed of silicon nitride, silicon oxynitride, or a combination thereof.

In some embodiments, the insulating film 128 may be formed to a thickness of from about 100 Å to about 600 Å, but the inventive concept is not limited thereto.

Referring to FIG. 3C, a doped mold film 130 and an undoped capping mold film 136 may be sequentially formed on the insulating film 128.

In some embodiments, the doped mold film 130 may be an oxide film containing a dopant, and the doped capping mold film 136 may be an oxide film that does not contain a dopant.

The doped mold film 130 may be formed by using a thermal CVD process or a PECVD process.

In a process of forming the doped mold film 130 according to an exemplary embodiment, a flow rate of at least one dopant source supplied to the insulating film 128 formed on the substrate 110 is continuously varied, and the at least one dopant source, a silicon source, and an oxygen source may be supplied together to the insulating film 128. Thus, the doped mold film 130 may be formed on the insulating film 128 such that a dopant concentration gradient in the doped mold film 130 continuously varies in a thickness direction (Z direction in FIG. 3C).

In some embodiments, the doped mold film 130 may include a BPSG film, and the capping mold film 136 may include a USG film.

In some embodiments, the doped mold film 130 may be formed to a thickness of from about 1000 Å to about 20000 Å. The capping mold film 136 may be formed to a thickness of from about 500 Å to about 2000 Å.

To form the doped mold film 130 and the capping mold film 136, any one of the processes of forming the silicon oxide film 30 and the planarized capping silicon oxide film 36A as described with reference to FIGS. 1A to 2B, or various modified or changed processes thereof within the scope of the inventive concept, may be performed.

In some embodiments, the doped mold film 130 may be formed such that the sum of the concentrations of at least one dopant species continuously decreases in a direction away from the substrate 110 in the thickness direction of the doped mold film 130. For example, the doped mold film 130 may be a BPSG film containing dopants B and P. The doped mold film 130 may be formed such that the sum of the concentrations of the dopant B and the dopant P continuously decreases in a direction away from the substrate in the thickness direction (Z direction) of the doped mold film 130.

In some embodiments, the formation of the doped mold film 130 may include a step of supplying a source (e.g., TEB) of the dopant B to the substrate 110 on which the insulating film 128 is formed at continuously reduced flow rates with respect to time, while supplying a source (e.g., TEPO) of the dopant P at a constant flow rate with respect to time. In some other embodiments, the formation of the doped mold film 130 may include a step of supplying the source of the dopant P at a continuously reduced flow rate with respect to time to the substrate 110 on which the insulating film 128 is formed, while maintaining a constant flow rate of the source of the dopant B.

In some embodiments, during the formation of the doped mold film 130, at least one of a flow rate of the source of the dopant B and a flow rate of the source of the dopant P may continuously decrease over time.

The doped mold film 130 may include a first doped mold film 132 and a second doped mold film 134, which first and second doped mold films may include different kinds of dopants wherein the dopant concentrations are continuously reduced in a direction away from the substrate.

The first doped mold film 132 may be formed such that a concentration of the dopant B continuously decreases in a direction away from the substrate 110 in the thickness direction (Z direction) of the first doped mold film 132. The second doped mold film 134 may be formed such that a concentration of the dopant P continuously decreases in a direction away from the substrate 110 in the thickness direction (Z direction) of the second doped mold film 134.

To form the first doped mold film 132, a source (e.g., TEB) for providing the dopant B to the substrate 110 on which the insulating film 128 is formed and a source (e.g., TEPO) for providing the dopant P may be supplied together. In this case, the sum of flow the rates of TEB and TEPO may be continuously decreased with respect to time. In some embodiments, the flow rate of TEB may continuously decrease with respect to time, while the flow rate of TEPO may be maintained constant with respect to time.

To form the second doped mold film 134, at least one of a source (e.g., TEB) for providing the dopant B to the substrate 110 on which the insulating film 128 is formed and a source (e.g., TEPO) for providing the dopant P may be supplied. In some embodiments, to form the second doped mold film 134, only the TEPO may be supplied at continuously reduced flow rates with respect to time, while the TEB may or may not be supplied at a constant flow rate.

In some embodiments, to form the doped mold film 130 including the first doped mold film 132 and the second doped mold film 134, source supply methods used in the first operation Ia and the second operation Ib of the operation I for forming the doped oxide film 30, as described with reference to FIG. 2A, may be used. In some other embodiments, to form the doped mold film 130 including the first doped mold film 132 and the second doped mold film 134, a source supply method used in the operation I of forming the doped oxide film 30 described with reference to FIG. 2B, may be used.

A thickness ratio of the first doped mold film 132 relative to the second doped mold film 134 is not specifically limited but may be selected within a large range. For example, a thickness ratio of the first doped mold film 132 relative to the second doped mold film 134 may be selected from the range of about 9:1 to about 1:9.

Referring to FIG. 3D, a first support film 140 may be formed on the capping mold film 136.

The first support film 140 may have a thickness of from about 50 Å to about 3000 Å.

The first support film 140 may be formed of a material having an etch selectivity with respect to the doped mold film 130 and the capping mold film 136. Also, when the doped mold film 130 and the capping mold film 136 are intended to be subsequently removed by a lift-off process using, for example, limulus amoebocyte lysate (LAL) containing ammonium fluoride (NH$_4$F), fluoric acid (HF), and water, the first support film 140 may advantageously be formed of a material having a relatively low etch rate with respect to LAL.

In some embodiments, the first support film 140 may be formed of silicon nitride, silicon carbonitride, tantalum oxide, titanium oxide, or a combination thereof, but a material forming the first support film 140 is not limited to the examples.

In some embodiments, the first support film 140 may have a multilayered structure. For example, the first support film 140 may have a multilayered structure formed by sequentially stacking at least two materials selected from a silicon nitride film, a silicon carbonitride film, a tantalum oxide film, and a titanium oxide film.

Referring to FIG. 3E, an upper mold film 150 may be formed on the first support film 140.

The upper mold film 150 may include an oxide film.

The upper mold film 150 may be formed by using a different process from the process used for forming the doped mold film 130 and for forming the capping mold film 136. In some embodiments, the upper mold film 150 may include, for example, an oxide formed by using a high density plasma chemical vapor deposition (HDP CVD) process, but the inventive concept is not limited thereto.

The upper mold film 150 may be formed to a thickness of from about 3000 Å to about 4000 Å.

Referring to FIG. 3F, a second support film 160 may be formed on the upper mold film 150.

The second support film 160 may have a greater thickness than the first support film 140. For example, the second support film 160 may have a thickness of from about 100 Å to about 4000 Å, but the inventive concept is not limited thereto.

The second support film 160 may be formed of a material having an etch selectivity with respect to the doped mold film 130, the capping mold film 136, and the upper mold film 150. Also, the second support film 160 may be formed of a material having a relatively low etch rate with respect to an etching atmosphere (e.g., LAL) used to remove the doped mold film 130, the capping mold film 136, and the upper mold film 150 in a subsequent process.

In some embodiments, the second support film 160 may include silicon nitride, silicon carbonitride, tantalum oxide, titanium oxide, or a combination thereof, but a material forming the second support film 160 is not limited thereto.

In some embodiments, the second support film 160 may have a multilayered structure. For example, the second support film 160 may have a multilayered structure formed by sequentially stacking at least two materials selected from a silicon nitride film, a silicon carbonitride film, a tantalum oxide film, and a titanium oxide film.

Referring to FIG. 3G, a sacrificial film 172 and a mask pattern 174 may be sequentially formed on the second support film 160.

The sacrificial film 172 may include an oxide film, such as a BPSG film, a phospho silicate glass (PSG) film, a USG film, a spin on dielectric (SOD) film, or an HDP oxide film. The sacrificial film 172 may have a thickness of from about 500 Å to about 2000 Å. The sacrificial film 172 may serve to protect the second support film 160.

The mask pattern 174 may include an oxide film, a nitride film, a poly-Si layer, a photoresist layer, or a combination thereof. A region in which a lower electrode of a capacitor will be formed may be defined by the mask pattern 174.

Referring to FIG. 3H, the sacrificial film 172, the second support film 160, the upper mold film 150, the first support film 140, the capping mold film 136, and the doped mold film 130 may be sequentially dry etched by using the mask pattern 174 as an etch mask and using the insulating film 128 as an etch stop layer, thereby forming a sacrificial pattern 172P, a second support pattern 160P, an upper mold pattern 150P, a first support pattern 140P, a capping mold pattern 136P, and a doped mold pattern 130P to define a plurality of preliminary holes H11. Subsequently, by continuing the etching process, at least a portion of the insulating film 128 may also be etched to form an insulating pattern 128P that exposes at least some of the conductive regions 124.

An inner sidewall of each of the preliminary holes H11 may include an inclination surface having a first inclination angle θ1 (e.g., a first inclination angle of about 80° to about) 85° with respect to a plane surface that is parallel to a main surface of the substrate 110, as seen in FIG. 3A. Thus, a width WB of a bottom surface of each of the preliminary holes H11 may be smaller than a width WI of an inlet thereof. For example, the width WB of the bottom surface of each of the preliminary holes H11 may be about 85% of the width WI of the inlet thereof.

A plurality of through holes TH, each of which has a width 128W1 that is substantially equal to or smaller than the bottom WB of the bottom surface of each of the preliminary holes H1, may be formed in the insulating pattern 128P.

Since the inner sidewall of each of the preliminary holes H11 has the first inclination angle θ1 with respect to the plane surface that is parallel to the main surface of the substrate 110, a sidewall of the doped mold pattern 130P exposed by each of the preliminary holes H11 may also include an inclination surface that forms the first inclination angle θ1 with respect to the plane surface that is parallel to the main surface of the substrate 110.

Referring to FIG. 3I, the inner sidewall of each of the preliminary holes H11 may be wet processed by using an etchant 178 to increase a horizontal width of each of the preliminary holes H11. Thus, an extension hole H12 may be formed.

An etchant capable of increasing an etched amount in proportion to a concentration of a dopant contained in the doped mold pattern 130P (refer to FIG. 3H) may be used as the etchant 178. For example, a diluted sulfuric acid peroxide (DSP) solution may be used as the etchant 178.

While the wet process is being performed by using the etchant 178 to form the extension hole H12, that wet process may also remove material from each of the second support pattern 160P, the upper mold pattern 150P, the first support pattern 140P, and the capping mold pattern 136P, which may define the preliminary holes H11 as shown in FIG. 3H, so as to leave a more uniform width of an exposed inner sidewall of each of the preliminary holes H11.

In contrast, as a dopant concentration of the doped mold pattern 130P (refer to FIG. 3H) increases, an etch rate of the etchant 178 may further increase. When the dopant concentration continuously decreases from a bottom surface of the doped mold pattern 130P to a top surface thereof, the etch rate of the etchant 178 may continuously increase from the top surface of the doped mold pattern 130P to the bottom surface thereof during the formation of the extension hole H12.

Thus, the doped mold 130Q defining a portion of the extension hole H12 may be obtained. A sidewall of the doped mold 130Q, which may define the extension hole H12, may form a second inclination angle θ2, which is closer to a right angle than the first inclination angle θ1 (refer to FIG. 3H), relative to the plane surface that is parallel to the main surface of the substrate 110.

In some embodiments, a sidewall SW1 of the doped mold 130Q, which defines the extension hole H12, may be at a right angle to the plane surface that is parallel to the main surface of the substrate 110. In some other embodiments, sidewalls of the doped mold 130Q, which define the extension hole H12, may include an inclination surface having an inclination angle of about ±3° with respect to a surface that is at a right angle to the plane surface that is parallel to the main surface of the substrate 110. Herein, a term "inclination angle" refers to an angle formed by a target surface with the plane surface that is parallel to the main surface of the substrate 110. Assuming that the target surface (e.g., a sidewall surface of the doped mold 130Q) inclines further away from the substrate 110 based on a reference line that is at a right angle to the plane surface that is parallel to the main surface of the substrate 110, as the target surface becomes farther from the reference line, the target surface may be further inclined to be away from the centerline of the hole H1 or the extension hole H12. In this case, the inclination angle may be defined as being reduced in a negative (−) direction. In contrast, as the target surface becomes farther from the reference line, the target surface may be further inclined toward the centerline of the hole H1 or the extension hole H12, and in this case the inclination angle may be defined as increasing in a positive (+) direction.

In some embodiments, a width BW1 of the extension hole H12, which is defined by a bottom surface B of the doped mold 130Q, may be substantially equal to a width TW1 of the extension hole 1112, which is defined by a top surface T of the doped mold 130Q. In some other embodiments, a ratio TW1/BW1 (representing the width BW1 defined by the bottom B of the extension hole H12 relative to the width TW1 defined by the top surface T thereof) may range about 0.9 to about 1.1. For example, a ratio TW1/BW1 of a second width BW1 defined by the bottom surface B to a third width TW1 defined by the top surface T may range from about 0.92 to about 1.0.

Meanwhile, while the wet process is performed by using the etchant 178 to form the extension hole H12, an etched amount of the insulating pattern 128P due to the etchant 178 may be smaller than an etched amount of a bottom surface of the doped mold 130Q due to the etchant 178. Thus, the plurality of through holes TH formed in the insulating pattern 128P may have a width 128W2, which is similar to or slightly greater than the width 128W1 (FIG. 3H) of the through holes TH before being processed with the etchant 178. Accordingly, the width 128W2 of the through holes TH formed in the insulating pattern 128P may be less than the width BW1 defined by the bottom surface B of the doped mold 130Q. Also, an inner sidewall of the extension hole H12, which is defined by the doped mold 130Q, may have a shape that is offset by a predetermined distance D from the inner sidewall of the through hole TH formed in the insulating pattern 128P. In some embodiments, the predetermined distance D may be at least 2 nm.

Referring to FIG. 3J, after the mask pattern 174 is removed from the resultant structure of FIG. 3H, a conductive film 180 for forming lower electrodes may be formed to cover inner sidewalls of the respective extension holes H12, an exposed surface of the insulating pattern 128P, surfaces of the conductive regions 124 exposed by the respective extension holes H12, and an exposed surface of the sacrificial pattern 172P.

The conductive film 180 for forming the lower electrodes may be conformally formed on the sidewalls of the extension holes H12 to leave partial inner spaces (openings) of the respective extension holes H12, as seen in FIG. 3J.

In some embodiments, the conductive film 180 for forming the lower electrodes may include a doped semiconductor, a conductive metal nitride, a metal, a metal silicide, a conductive oxide, or a combination thereof. For example, the conductive film 180 for forming the lower electrode may include TiN, TiAlN, TaN, TaAlN, W, WN, Ru, $RuO_2$, $SrRuO_3$, Ir, $IrO_2$, Pt, PtO, SRO ($SrRuO_3$), BSRO (($Ba,Sr$)$RuO_3$), CRO ($CaRuO_3$), LSCo (($La,Sr$)$CoO_3$), or a combination thereof, but a material that forms the conductive film 180 for forming the lower electrodes is not limited thereto.

The conductive film 180 for forming the lower electrodes may be formed by using a CVD process, a metal-organic CVD (MOCVD) process, or an atomic layer deposition (ALD) process. The conductive film 180 for forming the lower electrodes may be formed to a thickness of from about 20 nm to about 100 nm, but the inventive concept is not limited thereto.

Referring to FIG. 3K, an upper portion of the conductive film 180 for forming the lower electrodes may be partially removed so that the conductive film 180 for forming the lower electrodes may be separated into a plurality of lower electrodes LE1.

To form the plurality of lower electrodes LE1, an upper portion of the conductive film 180 for forming the lower electrodes and a sacrificial pattern 172P (refer to FIG. 3J) may be removed by using an etchback process or a CMP process until a top surface of the second support pattern 160P is exposed.

Each of the lower electrodes LE1 may extend from inside the through hole TH of the insulating pattern 128P in a direction away from the substrate 110 on the insulating pattern 128P.

Figure 4:
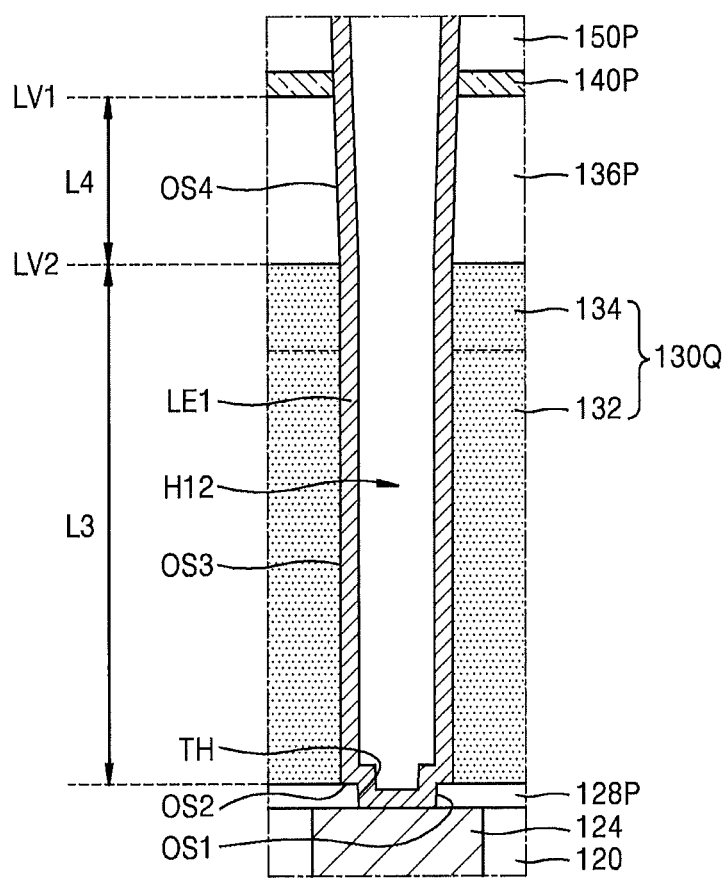
FIG. 4 is an enlarged view of a portion "IV" of FIG. 3K.

FIG. 4 is an enlarged view of a portion "IV" of FIG. 3K.

Referring to FIGS. 3K and 4, each of the lower electrodes LE1 may have a first outer wall surface OS1, a second outer wall surface OS2, a third outer wall surface OS3, and a fourth outer wall surface OS4. The first outer wall surface OS1 may contact a sidewall of the insulating pattern 128P in the through hole TH of the insulating pattern 128P. The second outer wall surface OS2 may contact a top surface of the insulating pattern 128P and extend in a lateral direction (X direction in FIGS. 3K and 4). The third outer wall surface OS3 may be spaced apart from the first outer wall surface OS1 with the second outer wall surface OS2 therebetween and extend above a corner portion of the insulating pattern 128P in a direction away from the substrate 110. The fourth outer wall surface OS4 may extend from the third outer wall surface OS3 in the direction away from the substrate 110.

In each of the lower electrodes LE1, the first outer wall surface OS1, the second outer wall surface OS2, and the third outer wall surface OS3 may be sequentially connected so that a stepped outer wall surface may be formed along the outside of each of the lower electrodes LE1.

In some embodiments, a first width LW1 (refer to FIG. 3K) of a portion of the first outer wall surface OS1 of the lower electrode LE1, which is closest to the third outer wall surface OS3, may be at least 2 nm less than a second width LW2 (refer to FIG. 3K) of a portion of the third outer wall surface OS3 of the lower electrode LE1, which is closest to the first outer wall surface OS1.

As shown in FIG. 4, the third outer wall surface OS3 may extend on the insulating pattern 128P in a direction away from the substrate 110. The third outer wall surface OS3 may extend to a second level LV2 closer to the substrate 110 than a first level LV1 at which the first support pattern 140P is formed. The fourth outer wall surface OS4 may extend from the second level LV2 corresponding to an uppermost portion of the third outer wall surface OS3 to the first level LV1.

In some embodiments, the third outer wall surface OS3 may include an inclination surface having an inclination angle of about ±3° with respect to a surface that is at a right angle to a plane surface that is parallel to the main surface of the substrate 110. For example, the third outer wall surface OS3 may form a right angle to the plane surface that is parallel to the main surface of the substrate 110.

Assuming that an angle formed by the third outer wall surface OS3 with the plane surface that is parallel to the main surface of the substrate 110 is a reference angle, the fourth outer wall surface OS4 may have an inclination angle smaller the reference angle. Thus, as the fourth outer wall surface OS4 inclines away from the substrate 110, the fourth outer wall surface OS4 may be inclined more than the third outer wall surface OS3 in a direction away from the centerline of the extension hole H12.

In some embodiments, a height L4 of the fourth outer wall surface OS4 may be smaller than a height L3 of the third outer wall surface OS3.

The plurality of lower electrodes LE1 may be connected to the conductive regions 124 through the through holes TH of the insulating pattern 128P.

Referring to FIG. 3L, the doped mold 130Q, the capping mold pattern 136P, and the upper mold pattern 150P may be removed, thereby exposing the outer wall surfaces of the plurality of cylindrical lower electrodes LE1 defining partial inner spaces of the extension hole H12, top surfaces and bottom surfaces of the first support pattern 140P and the second support pattern 160P, and the top surface of the insulating pattern 128P.

The doped mold 130Q, the capping mold pattern 136P, and the upper mold pattern 150P may be removed by using a wet etching process. For example, the doped mold 130Q, the capping mold pattern 136P, and the upper mold pattern 150P may be removed by a lift-off process using LAL or fluoric acid.

After the doped mold 130Q, the capping mold pattern 136P, and the upper mold pattern 150P are removed, the lower electrode LE1 may be supported by the first support pattern 140P and the second support pattern 160P.

Referring to FIG. 3M, a dielectric film 184 may be formed on a plurality of lower electrodes LE1.

The dielectric film 184 may be conformally formed on inner wall surfaces of the plurality of lower electrodes LE1, partial regions of the outer wall surfaces of the plurality of lower electrodes LE1, and the bottom surfaces and the top surfaces of the first support pattern 140P, the second support pattern 160P, and the insulating pattern 128P. However, since the first outer wall surface OS1 and the second outer wall surface OS2 of the outer wall surfaces of the plurality of lower electrodes LE1 are in contact along their entire lengths with the insulating pattern 128P, the dielectric film 184 may not be formed on the first outer wall surface OS1 and the second outer wall surface OS2.

The dielectric film 184 may include a nitride, an oxide, a metal oxide, or a combination thereof. For example, the dielectric film 184 may include a single film or a multilayered structure formed of silicon nitride, silicon oxide, a metal oxide (e.g., $HfO_2$, $ZrO_2$, $Al_2O_3$, $La_2O_3$, $Ta_2O_3$, and $TiO_2$), a perovskite dielectric material (e.g., STO ($SrTiO_3$), BST (($Ba,Sr)TiO_3$), $BaTiO_3$, PZT, and PLZT, or a combination thereof.

In some embodiments, the dielectric film 184 may have a thickness of from about 50 Å to about 150 Å, but the inventive concept is not limited thereto.

The dielectric film 184 may be formed by using a CVD process, a physical vapor deposition (PVD) process, or an ALD process.

Referring to FIG. 3N, an upper electrode UE1 may be formed on the dielectric film 184.

A capacitor may be formed by the combination of the lower electrode LE1, the dielectric film 184, and the upper electrode UE1.

The upper electrode UE1 may be formed of a doped semiconductor, a conductive metal nitride, a metal, a metal silicide, a conductive oxide, or a combination thereof. For example, the upper electrode UE1 may be formed of TiN, TiAlN, TaN, TaAlN, W, WN, Ru, $RuO_2$, $SrRuO_3$, Ir, $IrO_2$, Pt, PtO, SRO ($SrRuO_3$), BSRO (($Ba,Sr)RuO_3$), CRO ($CaRuO_3$), LSCo (($La,Sr)CoO_3$), or a combination thereof, but a material forming the upper electrode UE1 is not limited to the above-described examples.

The upper electrode UE1 may be formed by using a CVD process, a MOCVD process, a PVD process, or an ALD process.

Although the method of manufacturing the IC device including the capacitor including the cylindrical lower electrode LE1 has been described with reference to FIGS. 3J to 3L, the inventive concept is not limited to the above-described structure of the lower electrode LE1. For example, a pillar-type lower electrode having no inner space may be formed instead of the cylindrical lower electrode LE1 as shown in FIGS. 3J to 3L.

The method of manufacturing the IC device as described with reference to FIGS. 3A to 3N according to exemplary embodiments, requires a specially formed mold for forming the lower electrode LE1. The doped mold film 130 (refer to FIG. 3C) is formed on the substrate 110 to have a dopant concentration gradient that continuously varies in a thickness direction by continuously varying a flow rate of at least one dopant source, with the result being that the doped mold 130Q may be formed to have the sidewall that continuously extends in an approximately or nearly orthogonal direction to the plane surface that is parallel to the main surface of the substrate 110.

In a comparative example, when a lower electrode is formed by a multilayered mold including a plurality of mold layers having constant dopant concentrations, a discontinuous surface having, for example, pointed spots, may be formed at a position of the lower electrode, which corresponds to an interface between two mold layers having different dopant concentrations. Thus, an effective area of a lower electrode of a capacitor may be reduced, and an electrical short circuit between adjacent lower electrodes may become highly likely to occur.

In contrast, in the method of manufacturing the IC device according to the exemplary embodiment, the doped mold 130Q may be formed to have a dopant concentration gradient, which continuously varies in a thickness direction over the entire range, thereby avoiding creating a section in which the dopant concentration gradient varies discontinuously. By forming the lower electrode LE1 by using the doped mold 130Q formed by using the above-described method, the lower electrode LE1 may have a smooth outer wall surface that continuously extends at an inclination angle of about ±3° with respect to a surface that is at a right angle to the plane surface that is parallel to the main surface of the substrate 110. Accordingly, a vertical profile of the lower electrode LE1 may be effectively ensured, and an effective area of the lower electrode LE1 may be maximized. Also, because a discontinuous surface having pointed spots is not formed on a sidewall of the lower electrode LE1 (which corresponds to the doped mold 130Q), an insulation margin between adjacent lower electrodes may be ensured, and the electrical properties of a capacitor comprising the lower electrode LE1 may be improved.

FIGS. 5A to 5G are cross-sectional views illustrating process operations for a method of manufacturing an IC device 200 (refer to FIG. 5G) according to other exemplary embodiments. In FIGS. 5A to 5G, the same reference numerals are used to denote the same elements as in FIGS. 3A to 3N, and detailed descriptions thereof are omitted.

Figure 5A:
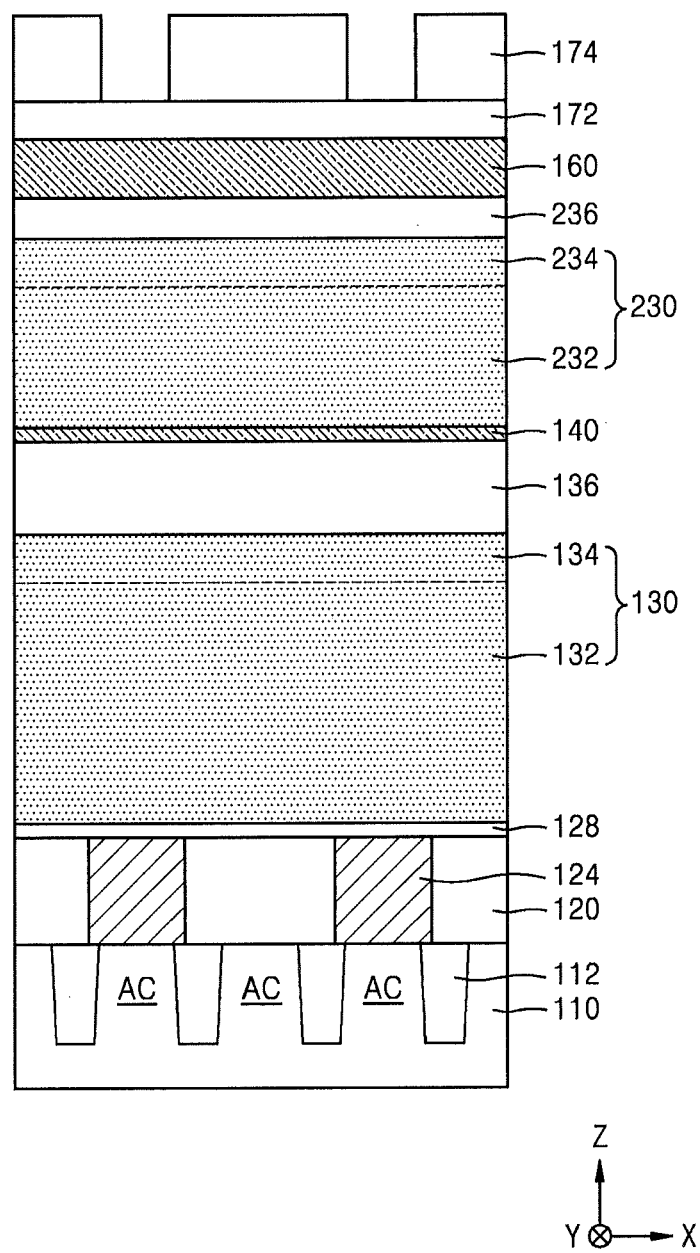
FIGS. 5A to 5G are cross-sectional views illustrating process operations of a method of manufacturing an IC device according to other exemplary embodiments.

Referring to FIG. 5A, in a similar manner to that described with reference to FIGS. 3A to 3G, a stack structure including a plurality of mold films and a plurality of support films may be formed on a substrate 110, and a sacrificial film 172 and a mask pattern 174 may be formed on the stack structure.

However, in the embodiment of FIG. 5A, a dopant upper mold film 230 and an upper capping mold film 236 may be continuously formed instead of the upper mold film 150 included in the stack structure shown in FIG. 3G.

The doped upper mold film 230 may be an oxide film having a dopant concentration gradient that continuously varies in a thickness direction. In some embodiments, the doped upper mold film 230 may be a BPSG film having a dopant concentration gradient that continuously varies in the thickness direction. The doped upper mold film 230 may include a first doped upper mold film 232 and a second doped upper mold film 234 containing different kinds of dopants, the concentrations of which are continuously reduced in a thickness direction.

The upper capping mold film 236 may be an undoped oxide film. In some embodiments, the upper capping mold film 236 may be a USG layer.

The doped upper mold film 230, comprising the first doped upper mold film 232 and the second doped upper mold film 234, and the upper capping mold film 236 may be substantially the same, respectively, as the doped mold film 130, comprising the first doped mold film 132 and the second doped mold film 134, and the capping mold film 136 described with reference to FIGS. 3A to 3G. However, a thickness of each of the doped upper mold film 230, comprising the first doped upper mold film 232 and the second doped upper mold film 234, and the upper capping mold film 236, and also a dopant concentration of the doped upper mold film 230, may be variously selected as needed to suit particular processing/fabrication objectives.

Figure 5B:
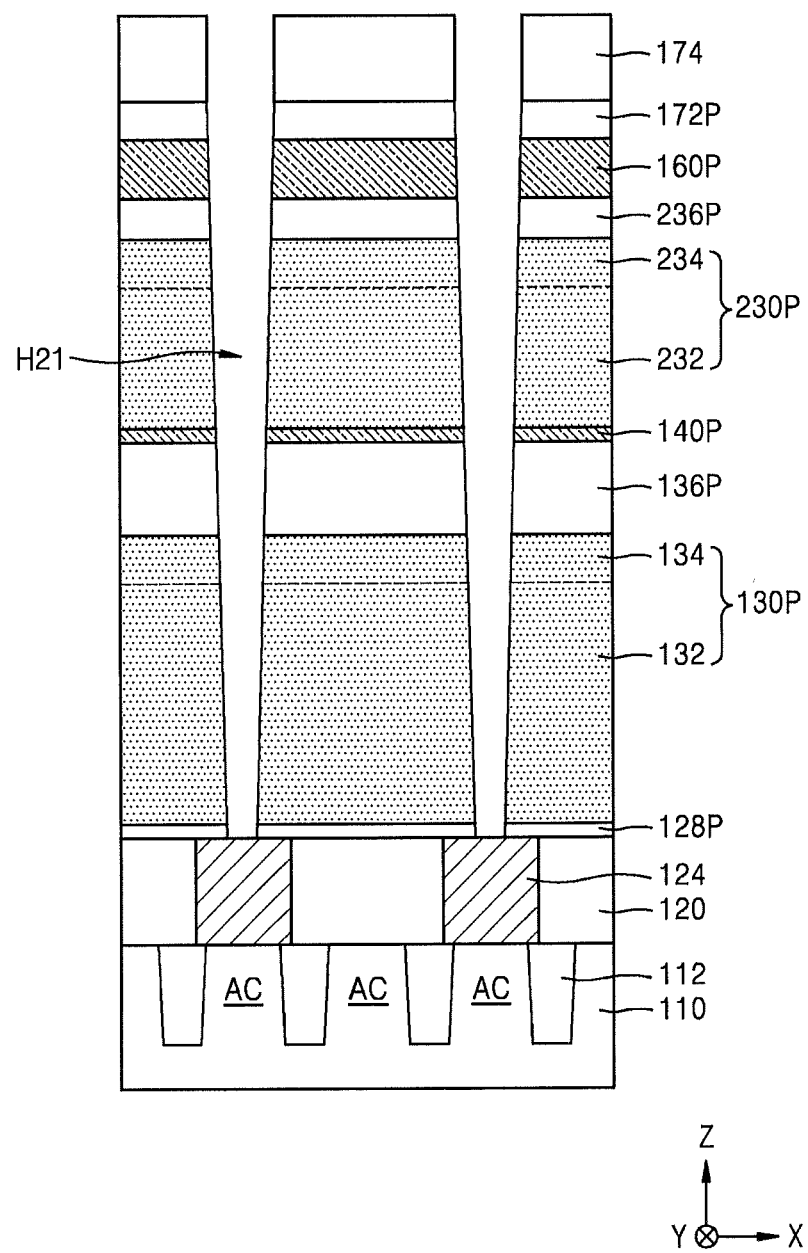

Referring to FIG. 5B, in a similar manner to that described with reference to FIG. 3H, the sacrificial film 172, the second support film 160, the upper capping mold film 236, the doped upper mold film 230, the first support film 140, the capping mold film 136, and the doped mold film 130 may be sequentially dry etched by using the mask pattern 174 as an etch mask and using the insulating film 128 as an etch stop layer. Subsequently, by continuing the etching process, the insulating film 128 may also be etched to form a plurality of preliminary holes H21.

After the plurality of preliminary holes H21 are formed, a doped upper mold pattern 230P and an upper capping mold pattern 236P may be formed between the first support pattern 140P and the second support pattern 160P.

Figure 5C:
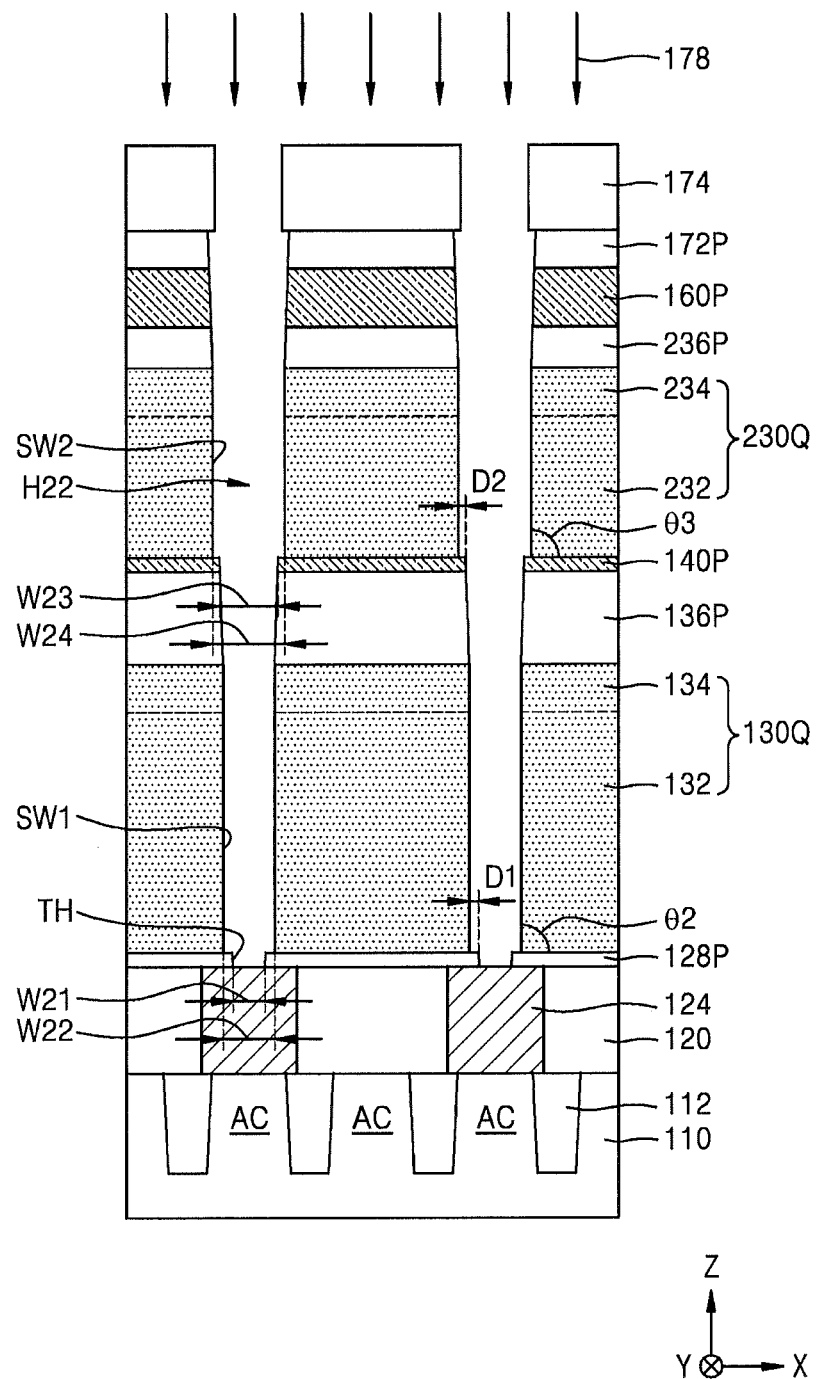

Referring to FIG. 5C, in a similar manner to that described with reference to FIG. 3I, a horizontal width of the preliminary holes H21 may be increased by wet processing inner sidewalls of the preliminary holes H21 using an etchant 178, thereby forming extension holes H22. As a result, not only a lower doped mold 130Q, defining a first portion of the extension hole H22, but also an upper doped mold 230Q, defining another portion of the extension hole H22, may be formed.

A sidewall SW2 of the upper doped mold 230Q, which partly defines the extension hole H22, may form a third inclination angle θ3, which is closer to a right angle than an inclination angle formed by the inner sidewall of each of the preliminary holes H21 (refer to FIG. 5B), with the plane surface that is parallel to the main surface of the substrate 110. A sidewall SW2 of the upper doped mold 230Q, which partly defines the extension hole H22, may include an inclination surface having an inclination angle of about ±3° with respect to a surface that is at a right angle to the plane surface that is parallel to the main surface of the substrate 110. In some embodiments, the inclination angle θ3 of the sidewall SW2 of the upper doped mold 230Q may be equal to the inclination angle θ2 of the sidewall SW1 of the lower doped mold 130Q. For example, each of the sidewall SW1 of the lower doped mold 130Q and the sidewall SW2 of the upper doped mold 230Q may extend substantially orthogonal to the plane surface that is parallel to the main surface of the substrate 110.

While the wet process is being performed by using the etchant 178 to form the extension hole H22, an etch rate of each of the insulating pattern 128P, the first support pattern 140P, and the second support pattern 160P by the etchant 178 may be smaller than an etch rate of each of a lower portion of the lower doped mold 130Q and a lower portion of the upper doped mold 230Q by the etchant 178. Accordingly, a width W21 of each of a plurality of through holes TH formed in the insulating pattern 128P may be less than a width W22 defined by a bottom surface of the lower doped mold 130Q. Also, an inner sidewall of the extension hole H22, which is formed by the lower doped mold 130Q, may be offset by a predetermined distance D1 from an inner sidewall of each of the through holes TH formed in the insulating pattern 128P. Furthermore, a width W23 of a through hole formed in the first support pattern 140P may be less than a width W24 defined by a bottom surface of the upper doped mold 230Q. In addition, an inner sidewall of the extension hole H22, which is formed by the upper doped mold 230Q, may be offset by a predetermined distance D2 from an inner sidewall of the through hole formed in the first support pattern 140P.

Figure 5D:
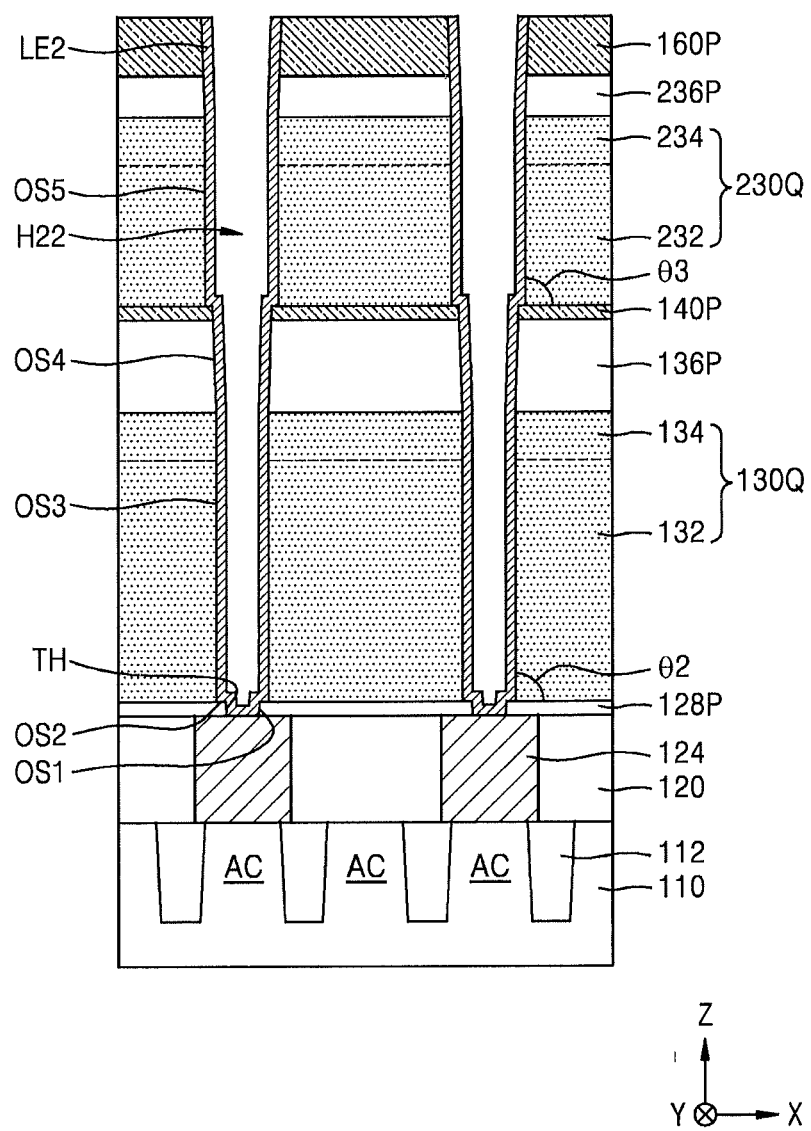

Referring to FIG. 5D, in a similar manner to that described with reference to FIG. 3J, after the mask pattern 174 is removed from the resultant structure of FIG. 5C, a conductive film (as seen in FIG. 3J but not shown in the FIGS. 5A to 5G series of drawings) for forming lower electrodes may be formed to cover the inner sidewall of each of the extension holes H22, an exposed surface of the insulating pattern 128P, surfaces of conductive regions 124 exposed by the respective extension holes H22, and an exposed surface of a sacrificial pattern 172P, Thereafter, in a similar manner to that described with reference to FIG. 3K, an upper portion of the conductive layer for forming the lower electrodes may be partially removed and thereby separating the conductive layer into a plurality of lower electrodes LE2.

Each of the lower electrodes LE2 may include a first outer wall surface OS1, a second outer wall surface OS2, a third outer wall surface OS3, a fourth outer wall surface OS4, and a fifth outer wall surface OS5. The first outer wall surface OS1 may contact a sidewall of the insulating pattern 128P in the through hole TH of the insulating pattern 128P. The second outer wall surface OS2 may contact a top surface of the insulating pattern 128P and extend in a lateral direction (X direction in FIG. 5D). The third outer wall surface OS3 may be spaced apart from the first outer wall surface OS1 with the second outer wall surface OS2 therebetween, and extend above a corner portion of the insulating pattern 128P in a direction away from the substrate 110. The fourth outer wall surface OS4 may extend from the third outer wall surface OS3 in a direction away from the substrate 110. The fifth outer wall surface OS5 may extend between the first support pattern 140P and the second support pattern 160P in a direction away from the substrate and form a larger inclination angle than the inclination angle of the fourth outer wall surface OS4.

In some embodiments, the fifth outer wall surface OS5 may include an inclination surface having an inclination angle of about ±3° with respect to a surface that is at a right angle to the plane surface that is parallel to the main surface of the substrate 110. For example, the fifth outer wall surface OS5 may form a right angle with the plane surface that is parallel to the main surface of the substrate 110. In some embodiments, the inclination angle of the fifth outer wall surface OS5 may be equal to that of the third outer wall surface OS3.

Detailed descriptions of the conductive film for forming the lower electrodes LE2 are substantially the same as those of the conductive film 180 for forming the lower electrodes LE1, which are provided with reference to FIGS. 3J and 3K.

Figure 5E:
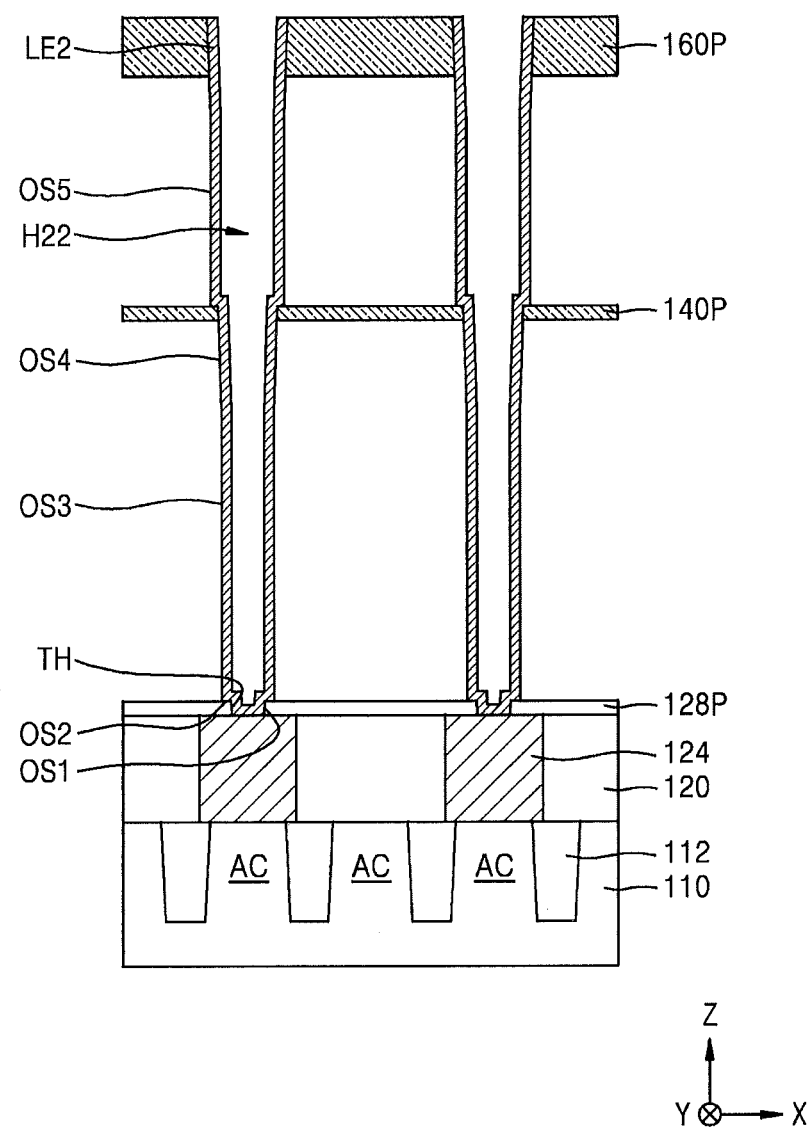

Referring to FIG. 5E, the lower doped mold 130Q, the capping mold pattern 136P, the upper doped mold 230Q, and the upper capping mold pattern 236P may be removed in a similar manner to that described with reference to FIG. 3L, thereby exposing outer wall surfaces of the plurality of cylindrical lower electrodes LE2, each of which defines a partial inner space of the extension hole H22, top surfaces and bottom surfaces of the first support pattern 140P and the second support pattern 160P, and a top surface of the insulating pattern 128P.

Figure 5F:
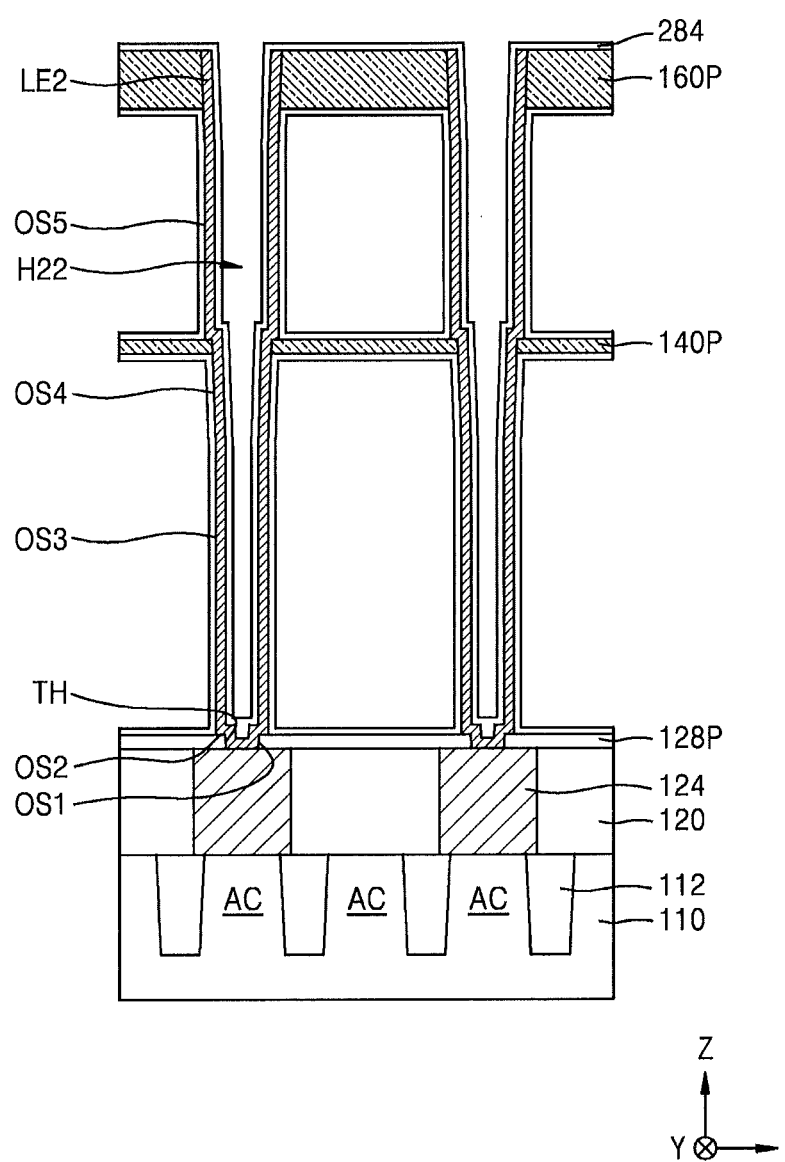

Referring to FIG. 5F, a dielectric film 284 may be formed on the plurality of lower electrodes LE2 in a similar manner to that described with reference to FIG. 3M.

A detailed configuration of the dielectric film 284 may be the same as that of the dielectric film 184 described with reference to FIG. 3M.

Figure 5G:
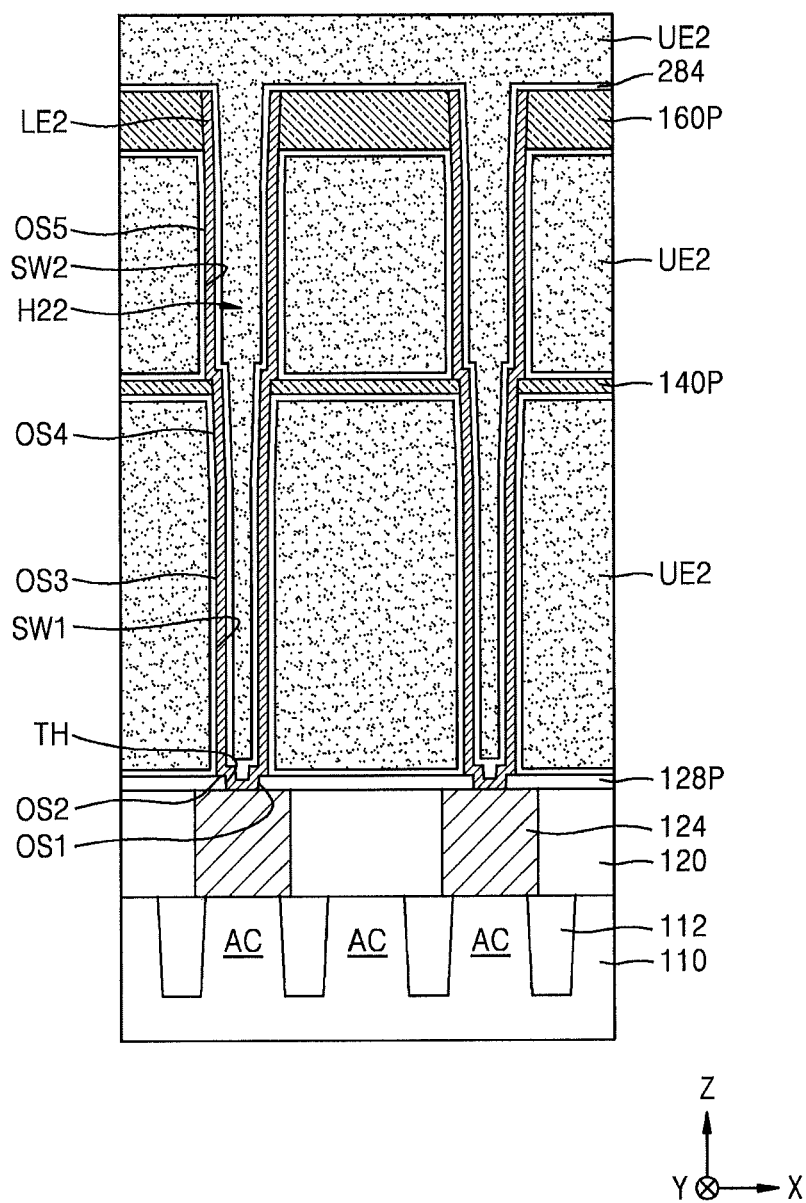

Referring to FIG. 5G, an upper electrode UE2 may be formed on the dielectric film 284 in a similar manner to that described with reference to FIG. 3N.

A detailed configuration of the upper electrode UE2 may be the same as that of the upper electrode UE1 described with reference to FIG. 3N.

A capacitor may be formed by the combination of the lower electrode LE2, the dielectric film 284, and the upper electrode UE2.

A method of manufacturing an IC device including a capacitor having the cylindrical lower electrode LE2 has been described above with reference to FIGS. 5A to 5G, but the inventive concept is not limited to the above-described structure of the lower electrode LE2. For example, a pillar-type lower electrode having no inner space may be formed instead of the cylindrical lower electrode LE2 as shown in FIGS. 5D to 5G.

The method of manufacturing the IC device described with reference to FIGS. 5A to 5G according to an exemplary embodiment requires a specially-formed mold for forming the lower electrode LE2. The lower doped mold film 130 and the upper doped mold film 230 (refer to FIG. 5A) may be formed on the substrate 110 to have a dopant concentration gradient that continuously varies in a thickness direction by continuously varying a flow rate of at least one dopant source, with the result that a lower doped mold 130Q and an upper doped mold 230Q may be formed to have a sidewall that continuously extends in an approximately or nearly orthogonal direction to the plane surface that is parallel to the main surface of the substrate 110. Thus, the lower doped mold 130Q and the upper doped mold 230Q may be formed to have a dopant concentration gradient such that a dopant concentration continuously varies in a thickness direction over the entire thickness range. Thus, the lower electrode LE2 may be formed by using the lower doped mold 130Q and the upper doped mold 230Q according to the exemplary embodiments. As a result, the lower electrode LE2 may have a smooth outer wall surface that continuously extends at an inclination angle of about ±3° with respect to a surface that is at a right angle to the plane surface that is parallel to the main surface of the substrate 110. Accordingly, a vertical profile of the lower electrode LE2 may be effectively ensured, and an effective area of the lower electrode LE2 may be maximized. Also, because a discontinuous surface having, for example, pointed spots, is not formed in a portion of a sidewall of the lower electrode LE2 (which corresponds to the lower doped mold 130Q and the upper doped mold 230Q), an insulation margin between adjacent lower electrodes may be ensured, and the electrical properties of a capacitor comprising the lower electrode LE2 may be improved.

Although structures of the IC devices 100 and 200 and the methods of manufacturing the same according to exemplary embodiments have been described thus far with reference to FIGS. 3A to 5G, one skilled in the art knows that IC devices having various structures may be manufactured by variously modifying and changing the IC devices 100 and 200 within the scope of the inventive concept.

Figure 6:
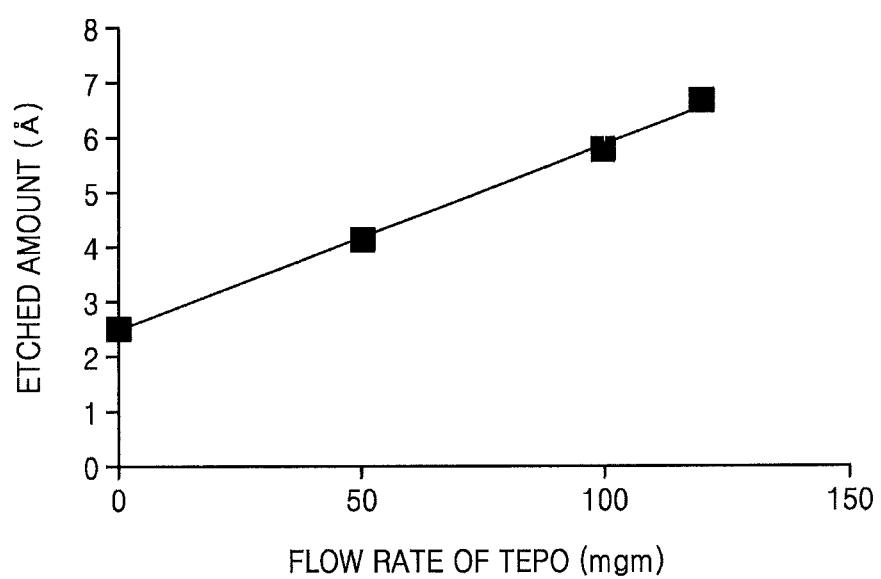
FIGS. 6 and 7 are graphs showing etched amounts relative to concentrations of dopant species in oxide films according to exemplary embodiments.
Figure 7:
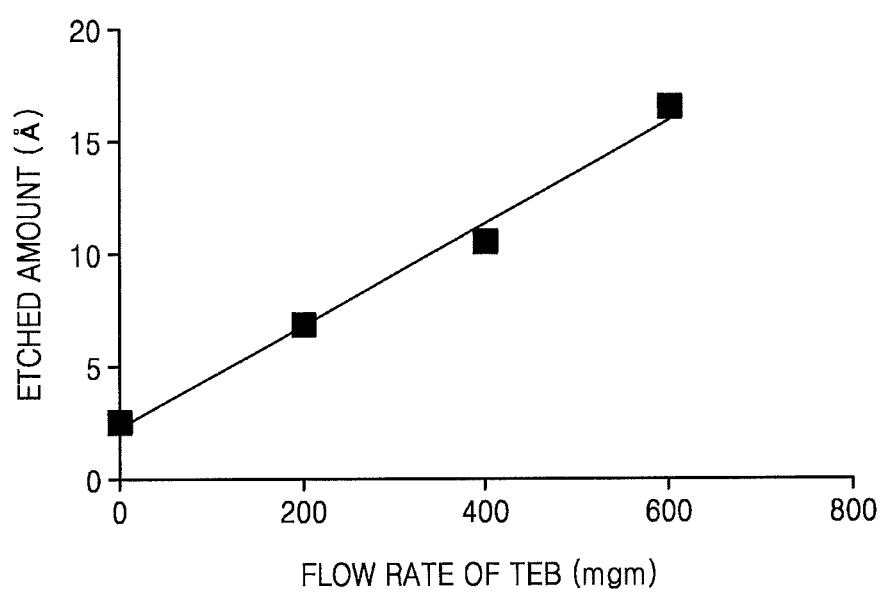

FIGS. 6 and 7 are respectively graphs showing etched amounts relative to concentrations of dopants in oxide films according to exemplary embodiments. Each of the oxide films may form at least one of the doped oxide film 30 shown in FIG. 1A, the doped mold 130Q shown in FIGS. 3G and 5A, and the doped upper mold 230Q shown in FIG. 5A.

More specifically, in FIG. 6, an etched amount relative to a concentration of a dopant P in a PSG film was determined. To obtain the results illustrated in FIG. 6, PSG films were formed by varying a flow rate of TEPO (a source of the dopant P), and the thicknesses of the PSG films after etching using a DSP etching solution for about 120 seconds were measured. Thus, it was concluded that, as the flow rate of TEPO increased (meaning a higher concentration of the P dopant in that portion of the PSG film), the amount of etching of the PSG film also increased. As a result, it can be seen that, as the concentration of the P dopant in the PSG film increased, the etched amount due to the DSP solution also increased.

In FIG. 7, an etched amount relative to a concentration of a dopant B in a BSG film was determined. To obtain the results illustrated in FIG. 7, BSG films were formed by varying a flow rate of TEB (a source of the dopant B), and the thicknesses of the BSG films after etching using a DSP etching solution for about 120 seconds were measured. Thus, it was concluded that as the flow rate of TEB increased (meaning a higher concentration of the B dopant in that portion of the BSG film), the amount of etching of the BSG film also increased. As a result, it can be seen that, as the concentration of the B dopant in the BSG film increased, the etched amount due to the DSP solution also increased.

Figure 8:
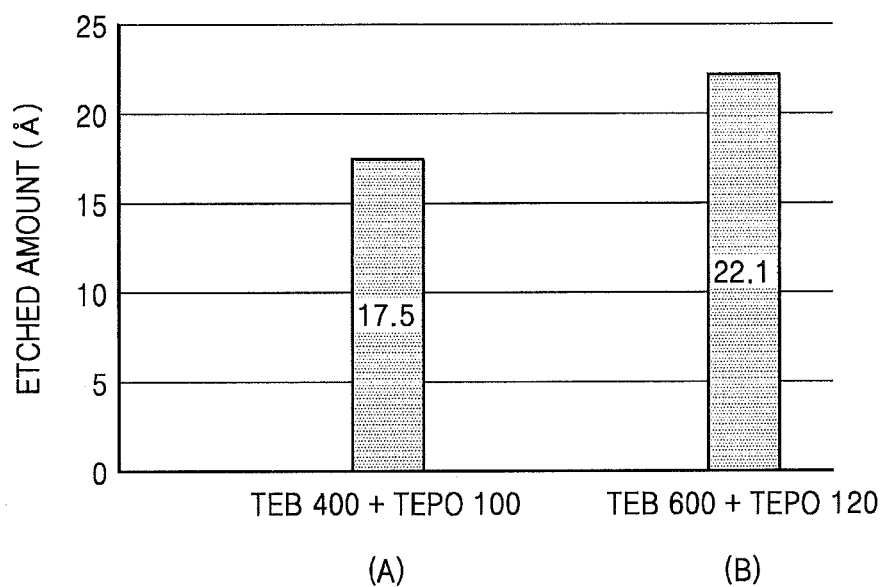
FIG. 8 is a graph showing an etched amount relative to the sum of concentrations of a plurality of dopant species in oxide films according to exemplary embodiments.

FIG. 8 is a graph showing an etched amount relative to the sum of the concentrations of a plurality of dopant species in oxide films according to exemplary embodiments. Each of the oxide films may form at least one of the doped oxide film 30 shown in FIG. 1A, the doped mold 130Q shown in FIGS. 3G and 5A, and the doped upper mold 230Q shown in FIG. 5A.

In FIG. 8, an etched amount relative to the sum of the concentrations of a dopant B and a dopant P in a BPSG film was determined. More specifically, in example (A), a BPSG film was formed by supplying TEB (a source of the dopant B) at a flow rate of about 400 mgm and TEPO (a source of the dopant P) at a flow rate of about 100 mgm, and the sum of the flow rates of TEB and TEPO was about 500 mgm. In example (B), a BPSG film was formed by supplying TEB (a source of the dopant B) at a flow rate of about 600 mgm and TEPO (a source of the dopant P) at a flow rate of about 120 mgm, and the sum of the flow rates of TEB and TEPO was about 720 mgm. In each of examples (A) and (B), the thickness of the BPSG film after etching using a DSP etching solution for about 120 seconds was measured. Thus, it was concluded that as the sum of the flow rates of TEB and TEPO increased (meaning a higher concentration of the P and B dopants in the BPSG film), the amount of etching of the BPSG film also increased. As a result, it can be seen that, as the sum of the concentrations of the dopants B and P in the BPSG film increased, an etched amount due to the DSP solution also increased.

The results of FIGS. 6 to 8 demonstrate the inventive concepts. When a mold required for forming a lower electrode is formed by using the method of manufacturing the IC device according to one of the exemplary embodiments, a doped mold film may be formed on a substrate to have a dopant concentration gradient that continuously varies in a thickness direction by continuously varying a flow rate of at least one dopant source. Thereafter, a doped mold may be formed to have a sidewall that continuously extends in an approximately or nearly orthogonal direction to a plane surface that is parallel to a main surface of the substrate. The lower electrode may be formed by using the doped mold. Thus, the lower electrode may have a smooth outer wall surface, which continuously extends at an inclination angle of about ±3° with respect to a surface that is at a right angle to the plane surface that is parallel to the main surface of the substrate.

The IC device according to one of the exemplary embodiments may be mounted by using semiconductor packages having various shapes. For example, the IC device according to an exemplary embodiment may be mounted by using a Package on Package (PoP) technique, a ball grid array (BGA) technique, a chip-scale package (CSP) technique, a plastic-leaded chip carrier (PLCC) technique, a plastic dual in-line package (PDIP) technique, a die-in-waffle-pack technique, a die-in-wafer-form technique, a chip-on-board (COB) technique, a ceramic dual in-line package (CERDIP) technique, a plastic metric quad flat-pack (MQFP) technique, a thin quad flat-pack (TQFP) technique, a small outline (SOIC) technique, a shrink small outline package (SSOP) technique, a thin small outline (TSOP) technique, a thin quad flatpack (TQFP) technique, a system-in-package (SIP) technique, a multi-chip package (MCP) technique, a wafer-level fabricated package (WFP) technique, or a wafer-level processed stack package (WSP) technique.

Figure 9:
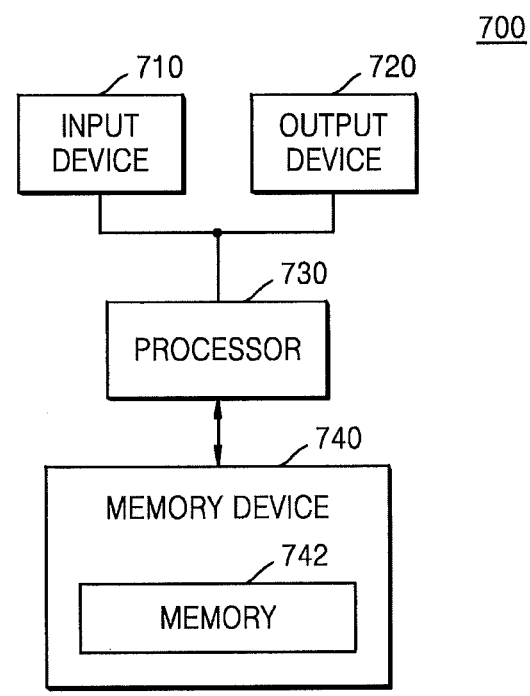
FIG. 9 is a block diagram of an electronic system including an IC device according to exemplary embodiments.

FIG. 9 is a block diagram of an electronic system 700 including an IC device according to an exemplary embodiment.

Referring to FIG. 9, the electronic system 700 may include an input device 710, an output device 720, a processor 730, and a memory device 740. In some embodiments, the memory device 740 may include a cell array including non-volatile memory cells and a peripheral circuit for read/write operations. In some other embodiments, the memory device 740 may include a non-volatile memory device and a memory controller.

The memory 742 included in the memory device 740 may include at least one of the IC devices 100 and 200 described with reference to FIGS. 3A to 5G according to the exemplary embodiments.

The processor 730 may be connected to each of the input device 710, the output device 720, and the memory device 740 through an interface and thereby control the overall operations.

Figure 10:
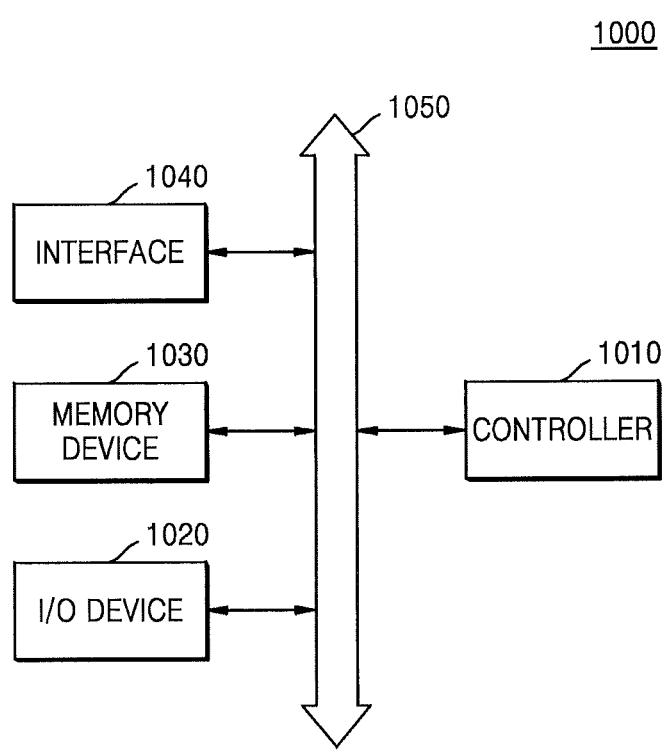
FIG. 10 is a diagram of a system including an IC device according to an exemplary embodiment.

FIG. 10 is a diagram of a system 1000 including an IC device according to an exemplary embodiment.

Referring to FIG. 10, the system 1000 may include a controller 1010, an input/output (I/O) device 1020, a memory device 1030, and an interface 1040. The system 1000 may be a mobile system or a system configured to transmit or receive information. In some embodiments, the mobile system may be a personal digital assistant (PDA), a portable computer, a web tablet, a wireless phone, a mobile phone, a digital music player, or a memory card. The controller 1010 may be configured to control an execution program in the system 1000. The controller 1010 may include a microprocessor (MP), a digital signal processor (DSP), a microcontroller (MC), or a device similar thereto. The I/O device 1020 may be used to input or output data to or from the system 1000. The system 1000 may be connected to an external device (e.g., a personal computer (PC)

or a network) using the I/O device 1020, and thereby exchange data with the external device. The I/O device 1020 may be, for example, a keypad, a keyboard, or a display device.

The memory device 1030 may store codes and/or data for operations of the controller 1010, or store data processed by the controller 1010. The memory device 1030 may include an IC device according to one of exemplary embodiments. For example, the memory device 1030 may include at least one of the IC devices 100 and 200 shown in FIGS. 3A to 5G.

The interface 1040 may be a data transmission path between the system 1000 and another external device. The controller 1010, the I/O device 1020, the memory device 1030, and the interface 1040 may communicate with one another through a bus 1050. The system 1000 may be used in a mobile phone, an MPEG-1 audio layer 3 (MP3) player, a navigation system, a portable multimedia player (PMP), a solid-state disk (SSD), or household appliances.

Figure 11:
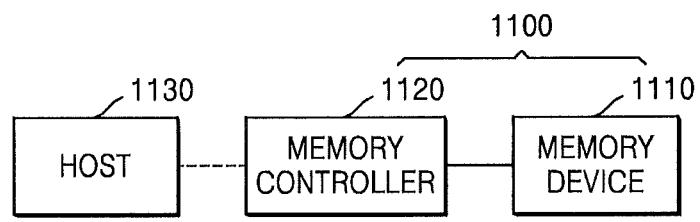
FIG. 11 is a diagram of a memory card including an IC device according to an exemplary embodiment.

FIG. 11 is a diagram of a memory card 1100 including an IC device according to an exemplary embodiment.

Referring to FIG. 11, the memory card 1100 may include a memory device 1110 and a memory controller 1120.

The memory device 1110 may store data. In some embodiments, the memory device 1110 may have non-volatile characteristics so that the memory device 1110 may retain stored data even if power supply is interrupted. The memory device 1110 may include an IC device according to one of the exemplary embodiments. For example, the memory device 1110 may include at least one of the IC devices 100 and 200 described with reference to FIGS. 3A to 5G according to exemplary embodiments.

The memory controller 1120 may read data stored in the memory device 1110 or store data of the memory device 1110 in response to read/write requests of a host 1130. The memory controller 1120 may include an IC device according to one of the exemplary embodiments. For example, the memory controller 1120 may include at least one of the IC devices 100 and 200 described with reference to FIGS. 3A to 5G according to exemplary embodiments.

While the inventive concept has been particularly shown and described with reference to exemplary embodiments thereof, it will be understood that various changes in form and details may be made therein without departing from the spirit and scope of the following claims.

What is claimed is:

1. A method of manufacturing an integrated circuit (IC) device, the method comprising:
    forming a doped mold film on a substrate having a conductive region while continuously varying a flow rate of at least one dopant source supplied to the substrate, the doped mold film having a dopant concentration gradient which continuously varies in a thickness direction of the doped mold film;
    forming a capping mold film on the doped mold film;
    forming a support film on the capping mold film;
    forming a hole in the support film, the capping mold film, and the doped mold film by etching the support film, the capping mold film, and the doped mold film, the hole exposing the conductive region; and
    forming an electrode within the hole, the electrode having an outer sidewall facing a sidewall of the support film, a sidewall of the capping mold film, and a sidewall of the doped mold film, each of which is exposed within the hole.

2. The method of claim 1, wherein a step of forming the doped mold film comprises forming the doped mold film such that a dopant concentration continuously decreases in a direction away from the substrate in the thickness direction of the doped mold film.

3. The method of claim 1, wherein a step of forming the doped mold film comprises continuously decreasing the total amount of the at least one dopant source supplied to the substrate as the thickness of the doped mold film increases.

4. The method of claim 1, wherein a step of forming the doped mold film comprises:
    forming a first doped mold film on the substrate such that a concentration of a first dopant species continuously decreases in a direction away from the substrate in the thickness direction of the first doped mold film; and
    forming a second doped mold film on the first doped mold film such that a concentration of a second dopant species different from the first dopant species continuously decreases in a direction away from the first doped mold film in the thickness direction of the second doped mold film.

5. The method of claim 4, wherein a step of forming the first doped mold film comprises supplying a first dopant source for providing the first dopant species to the substrate at a first dopant source flow rate while also supplying a second dopant source for providing the second dopant species to the substrate at a constant flow rate with respect to time with respect to time,
    wherein the first dopant source flow rate is continuously decreased with respect to time.

6. The method of claim 4, wherein a step of forming the second doped mold film comprises supplying a second dopant source at a flow rate which is continuously decreased with respect to time.

7. The method of claim 4, wherein at least a partial region of the doped mold film includes a plurality of dopant species including different dopant elements,
    wherein the sum of the respective concentrations of the plurality of dopant species included in the doped mold film continuously decreases in a direction away from the substrate in the thickness direction of the doped mold film in at least the partial region of the doped mold film.

8. The method of claim 1, wherein a step of forming the doped mold film comprises supplying a silicon source to the substrate while also supplying a plurality of dopant sources for providing a plurality of different dopant species to the substrate,
    wherein flow rates of the plurality of dopant sources are continuously decreased with respect to time,
    and also wherein the step of forming the capping mold film comprises supplying the silicon source without supplying a dopant source.

9. The method of claim 1, wherein a step of forming the hole comprises:
    forming a preliminary hole by sequentially dry etching the support film, the capping mold film, and the doped mold film, wherein a portion of the preliminary hole is defined by a doped mold pattern, and a first inclination angle is formed between a sidewall of the doped mold pattern and a plane surface that is parallel to a main surface of the substrate; and
    forming the hole by wet etching an inner sidewall of the preliminary hole, wherein a portion of the hole is defined by a doped mold pattern, and a second inclination angle greater than the first inclination angle is formed between a sidewall of the doped mold pattern and the plane surface that is parallel to the main surface of the substrate.

* * * * *